(12) United States Patent
Then et al.

(10) Patent No.: US 11,133,410 B2
(45) Date of Patent: Sep. 28, 2021

(54) FIELD-EFFECT TRANSISTORS AND METHODS OF MANUFACTURING THE SAME

(71) Applicant: Intel Corporation, Santa Clara, CA (US)

(72) Inventors: Han Wui Then, Portland, OR (US); Marko Radosavljevic, Portland, OR (US); Sansaptak Dasgupta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/649,517

(22) PCT Filed: Dec. 27, 2017

(86) PCT No.: PCT/US2017/068544
§ 371 (c)(1),
(2) Date: Mar. 20, 2020

(87) PCT Pub. No.: WO2019/132881
PCT Pub. Date: Jul. 4, 2019

(65) Prior Publication Data
US 2020/0312991 A1    Oct. 1, 2020

(51) Int. Cl.
| | |
|---|---|
| *H01L 29/778* | (2006.01) |
| *H01L 29/06* | (2006.01) |
| *H01L 29/08* | (2006.01) |
| *H01L 29/423* | (2006.01) |
| *H01L 29/66* | (2006.01) |
| *H01L 29/20* | (2006.01) |
| *H01L 29/205* | (2006.01) |

(52) U.S. Cl.
CPC ...... *H01L 29/7788* (2013.01); *H01L 29/0653* (2013.01); *H01L 29/0847* (2013.01); *H01L 29/4236* (2013.01); *H01L 29/42376* (2013.01); *H01L 29/66462* (2013.01); *H01L 29/2003* (2013.01); *H01L 29/205* (2013.01)

(58) Field of Classification Search
CPC ............. H01L 29/7788; H01L 29/0847; H01L 29/4236; H01L 29/2003; H01L 29/42376; H01L 29/7784
See application file for complete search history.

(56) References Cited

U.S. PATENT DOCUMENTS

| | | |
|---|---|---|
| 9,112,048 B2 | 8/2015 | Adekore |
| 9,972,708 B2 * | 5/2018 | Xie ................... H01L 29/1075 |
| 2003/0015755 A1 | 1/2003 | Hagemeyer |
| | | (Continued) |

OTHER PUBLICATIONS

International Search Report and Written Opinion from PCT/US2017/068544 notified Jul. 24, 2018, 13 pgs.

*Primary Examiner* — Changhyun Yi
(74) *Attorney, Agent, or Firm* — Green, Howard & Mughal LLP

(57) ABSTRACT

Field-effect transistors and methods of manufacturing the same are described herein. An example field-effect transistor includes a substrate, a source above the substrate, a semiconductor region above the source, a drain above semiconductor region, a polarization layer disposed on the semiconductor region between the drain and an end of the semiconductor region, and a gate above the source adjacent the end of the semiconductor region.

20 Claims, 11 Drawing Sheets

(56) References Cited

U.S. PATENT DOCUMENTS

| | | | |
|---|---|---|---|
| 2014/0266324 A1* | 9/2014 | Teo | H01L 29/7831 327/109 |
| 2016/0079409 A1 | 3/2016 | Okamoto et al. | |
| 2017/0278958 A1 | 9/2017 | Xie et al. | |
| 2017/0294536 A1 | 10/2017 | Anderson | |

* cited by examiner

US 11,133,410 B2

FIELD-EFFECT TRANSISTORS AND METHODS OF MANUFACTURING THE SAME

CLAIM OF PRIORITY

This Application is a National Stage Entry of, and claims priority to, PCT Application No. PCT/US2017/068544, filed on Dec. 27, 2017 and titled "FIELD-EFFECT TRANSISTORS AND METHODS OF MANUFACTURING THE SAME", which is incorporated by reference in its entirety for all purposes.

FIELD OF THE DISCLOSURE

This disclosure relates generally to semiconductors, and, more particularly, to field-effect transistors and methods of manufacturing the same.

BACKGROUND

Field-effect transistors (FETs), which are used in semiconductor devices such as microprocessors (e.g., processors) and/or other integrated circuits, have become smaller and smaller. While trying to decrease the size of FETs, certain inefficiencies have emerged because of the arrangement of the components of the FET.

Figure 1:
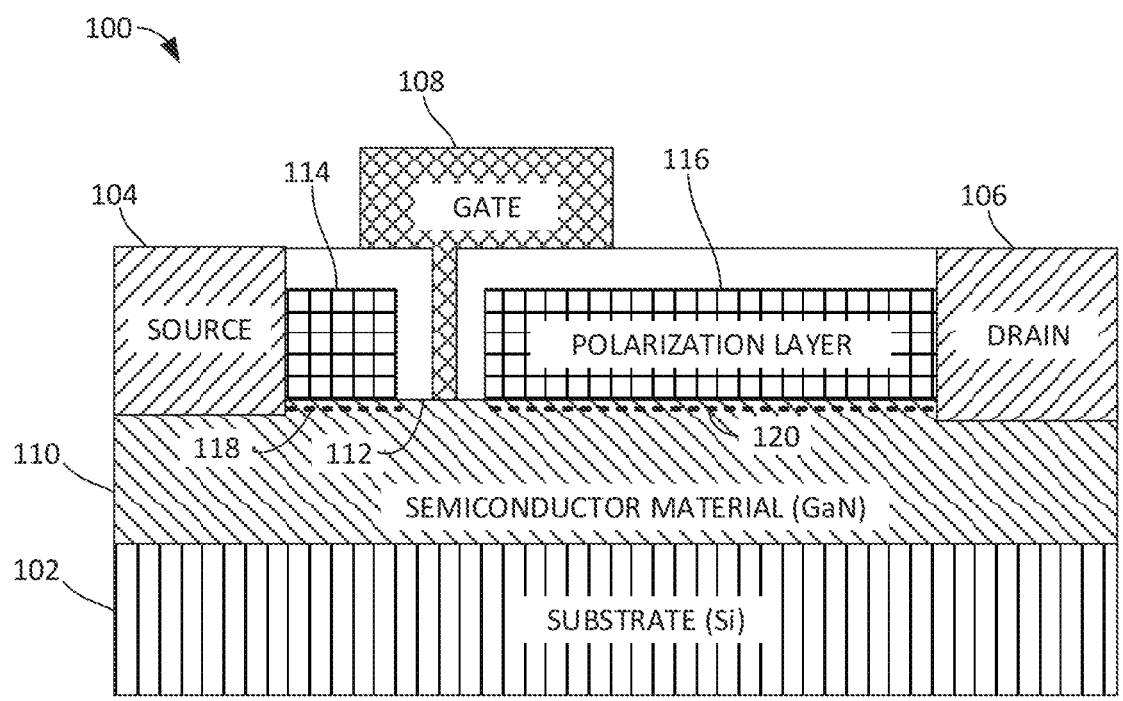
FIG. 1 is a cross-sectional view of a known high voltage field-effect transistor (FET).

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

As used herein, the term "above" is used with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

Disclosed herein are example field-effect transistors (FETs) and methods of making the same. Example FETs disclosed herein may utilize gallium nitride (GaN), which is a semiconducting material used in high voltage FETs. Example FETS disclosed herein are suitable for high voltage applications and are designed to result in less power leakage and lower unwanted capacitance than in known FETs. Further, example FETS disclosed herein enable better control of the channel length, as well as many other advantages. Before describing example FETs disclosed herein in detail, a brief description of a known FET is provided below.

FIG. 1 is a cross-sectional view of a known gallium nitride (GaN) based high voltage field-effect transistor (FET) 100. In FIG. 1, the components (e.g., regions, layers, etc.) of the high voltage FET 100 are shown in different patterns or cross-hatchings for illustrative purposes. These patterns or cross-hatchings are not indicative of any particular material, but are merely used to help illustrate the different components and boundaries therebetween. The known high voltage FET 100 includes a multilayered structure formed on a substrate 102 (sometimes referred to as a substrate layer or base), which is commonly formed of silicon (Si). The known high voltage FET 100 includes a source 104, a drain 106, and a gate 108. A semiconductor material 110 is layered on the substrate 102. The semiconductor material layer 110 is gallium nitride (GaN), which has a Wurtzite crystal structure. The source 104 and the drain 106 are disposed in contact a top 112 of the semiconductor material layer 110 (opposite the side of the semiconductor material layer 110 facing the substrate 102).

The known high voltage FET 100 also includes first and second polarization layers 114, 116. The polarization layers 114, 116 are disposed in contact with the top 112 of the semiconductor material layer 110 adjacent the source 104 and the drain 106, respectively. The first and second polarization layers 114, 116 are constructed of aluminum gallium nitride (AlGaN). When the first and second polarization layers 114, 116 are applied to the top 112 of the semiconductor material layer 110, first and second two-dimensional electron gas (2DEG) regions 118, 120 (shown as dashed lines) are formed in the top 112 of the semiconductor material layer 110 (e.g., in the top 3-4 nanometers (nm) of the GaN) directly beneath the first and polarization layers 114, 116, respectively. The first 2DEG region 118 extends from the source 104 (and, thus, forms an extension of the source 104). The second 2DEG region 120 extends from the drain 106 (and, thus, forms an extension of the drain 106). The gate 108 is disposed between the source 104 and the drain 106.

When a voltage is applied at the gate 108, charges in the semiconductor material layer 110 are populated beneath the gate 108 to thereby form a channel between the first and second 2DEG regions 118, 120 and allow current to flow between the source 104 and the drain 106. As can be seen, the known high voltage FET 100 has a generally planar or horizontal architecture, in that the source 104, the drain 106, the gate 108, and the first and second 2DEG regions 118, 120, are arranged in a generally horizontal manner, parallel to the substrate 102.

While the known high voltage FET 100 is operationally effective, it exhibits many drawbacks. For instance, especially with high voltage applications, charge leakage occurs between various points in the known high voltage FET 100. For example, parasitic leakage occurs between the drain 106 and substrate 102, parasitic capacitance occurs between the drain 106 and the source 104 ($C_{drain\text{-}source}$), parasitic capacitance occurs between the drain 106 and the substrate 102 ($C_{drain\text{-}substrate}$), etc.

Another drawback of the known high voltage FET 100 is defect density in the semiconductor material layer 110. In particular, when a crystal structure, such the gallium nitride (GaN) of the semiconductor material layer 110, is formed on another crystal structure, such as the silicon (Si) substrate 102, defects or imperfection are formed vertically in the crystal structure (i.e., in the semiconductor material 110). These defects lead to reduced efficiency and potential problems with charge flow through the semiconductor material layer 110.

Another drawback of the known high voltage FET 100 relates to the ability to control the length of the channel between the first and second 2DEG regions 118, 120. In particular, the channel is defined by the gap between the first and second 2DEG regions 118, 120. This gap is created using lithography or etching during the manufacturing process. These processes may exhibit inaccuracies. Thus, it is difficult to achieve fine control of the length of the channel. Also, the distance between the gate 108 and the source 104 results in resistance and, thus, inefficiencies in the known high voltage FET 100.

Example FETs are disclosed herein which are more efficient than the known high voltage FET 100 and address many of the drawbacks associated therewith. Example FETs disclosed herein are arranged vertically, or in a direction substantially perpendicular to the substrate. Example FETs disclosed herein may be used in high voltage applications, for example, and may be used in any type of semiconductor devices for memory, logic, etc.

Figure 2A:
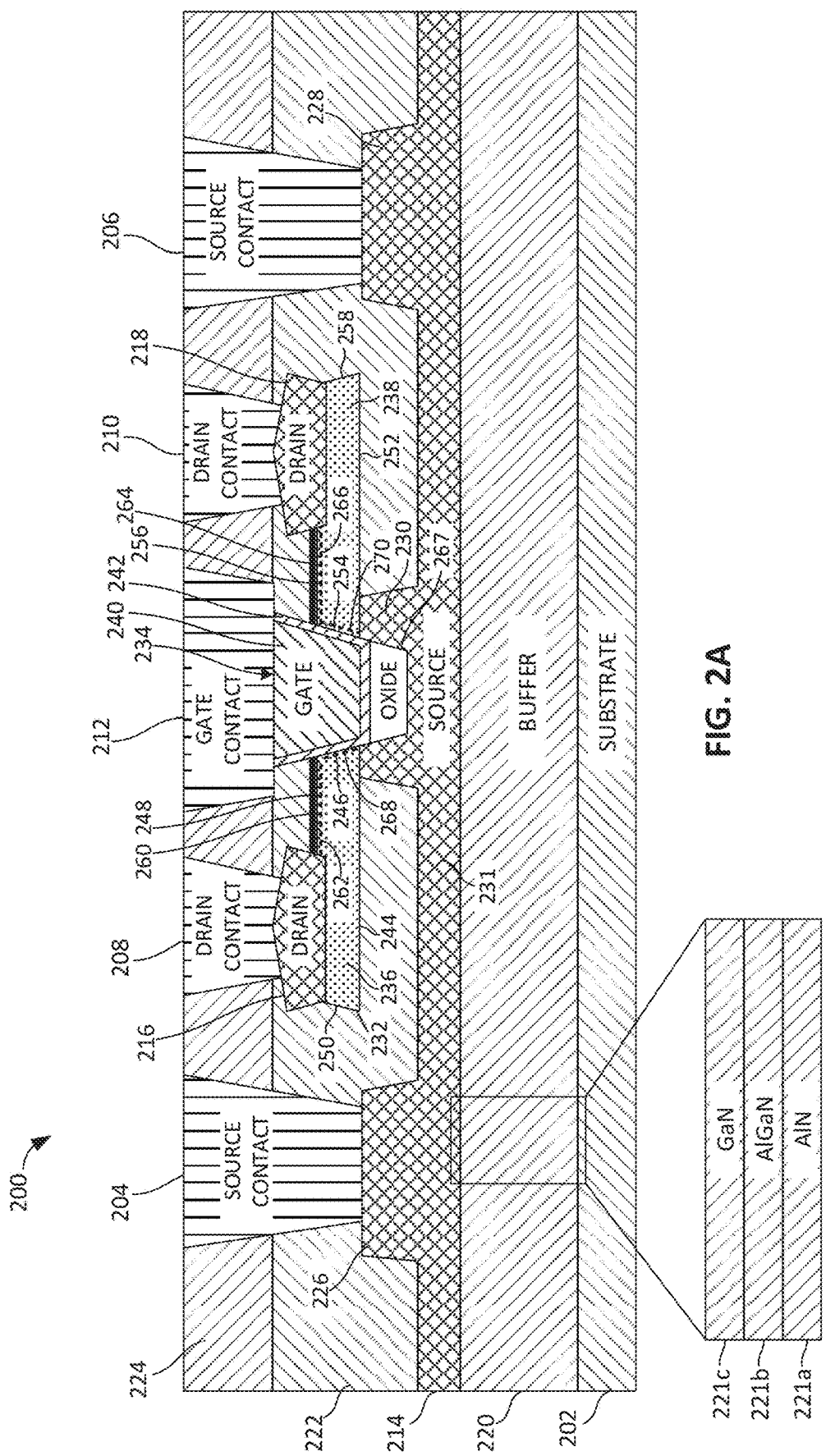
FIG. 2A is a cross-sectional view of an example field-effect transistor (FET) constructed in accordance with teachings of this disclosure.

FIG. 2A is a cross-sectional view of an example FET 200 constructed in accordance with teachings of this disclosure. In FIG. 2A, the components (e.g., regions, layers, etc.) of the example FET 200 are shown in different patterns or cross-hatchings for illustrative purposes. These patterns or cross-hatchings are not indicative of any particular material, but are merely used to help illustrate the different components and boundaries therebetween. In the illustrated example, the FET 200 is a multi-layered structured including a substrate 202. In some examples, the substrate 202 is constructed of silicon (Si). In other examples, the substrate 202 may be constructed of other suitable substrate materials.

In the illustrated example, the FET 200 includes a first source contact 204, a second source contact 206, a first drain contact 208, a second drain contact 210, and a gate contact 212. The first source contact 204 and the first drain contact 208 are disposed on one side of the gate contact 212 and the second source contact 206 and the second drain contact 210 are disposed on the opposite side of the gate contact 212. The first and second source contacts 204, 206 are disposed on (e.g., in contact with) a source region 214 (which may be referred to as a source), and the first and second drain contacts 208 (which may be referred to as drains), 210 are disposed on (e.g., in contact with) first and second drain regions 216, 218, respectively. The first and second source contacts 204, 206 may be electrically coupled to each other and form part of a same source contact. For example, a source contact may be in the shape of a ring (extending into and/or out of the page in FIG. 2A). In other examples, the first and second source contacts 204, 206 may be separate contacts that are electrically coupled via an electrical link (e.g., a link in a layer above the first and second source contacts 204, 206 in FIG. 2A). Likewise, the first drain contact 208 and the second drain contact 210 may be electrically coupled and form part of the same drain contact (e.g., a drain contact in the shape of a ring (e.g., a ring that extends into and/or out of the page in FIG. 2A and may be concentric with the source contact ring) or separate contacts that are electrically coupled via an electrical link, which may be disposed in a layer above the first and second drain contacts 208, 210 of FIG. 2A).

In the illustrated example, the FET 200 includes a buffer layer 220 disposed on the substrate 202. In some examples, the buffer layer 220 is in contact with the substrate 202. In some examples, the buffer layer 220 forms a buffer between the substrate 202 and the source region 214. In some examples, the source region 214 includes of N doped indium gallium nitride (N+InGaN). If gallium (Ga) and silicon (Si) come in contact, they form an alloy that can negatively affect the silicon (Si) substrate 202. Therefore, the buffer layer 220 provides a buffer between the gallium (Ga) in the source region 214 and the silicon (Si) in the substrate 202. In some examples, the buffer layer 220 includes three layers (as illustrated in the callout in FIG. 2A): a bottom layer 221a of aluminum nitride (AlN) (which may be in contact with the substrate 202), a middle layer 221b of aluminum gallium nitride (AlGaN), and a top layer 221c of gallium nitride (GaN) (which may be in contact with the source region 214). The layers of the buffer layer 220 may be epitaxially grown, layer-by-layer. Likewise, the source region 214 may be grown, via an epitaxial growth process, on top of the buffer layer 220. Epitaxy involves the growth of a crystalline overlay (e.g., a film or layer) on another (base) crystalline structure. The crystalline overlay grows horizontally and vertically from the base crystalline structure. For example, aluminum nitride (AlN), which has a crystalline structure, may be epitaxially grown on the silicon (Si) crystalline structure of the substrate 202. Similarly, the N doped indium gallium nitride (N+InGaN) of the source region 214 may be epitaxially grown on the gallium nitride (GaN) crystalline structure of the buffer layer 220.

In the illustrated example, the first and second source contacts 204, 206 are in contact with the source region 214. As such, the source region 214 has the same electric potential as the first and second source contacts 204, 206 (and, thus, a source voltage provided thereby). This same effect can be achieved without direct contact between the first and second source contacts 204, 206 and the source region 214 (e.g., by including an intervening conductive layer). Therefore, in some example, the first and second source contacts 204, 206 are not in contact with the source region 214, while still being at the same potential. In the illustrated example, the first and second source contacts 204, 206 extend through a first interlayer dielectric (ILD) layer 222 and a second ILD layer 224 to contact the source region 214. Similarly, the first and second drain contacts 208, 210 extend through the first and second ILD layers 222, 224 and contact the first and second drain regions 216, 218, respectively (and, thus, are at the same electrical potential as the first and second drain contacts 208, 210). This same effect can be achieved without direct contact between the first and second drain contacts 208, 210 and the first and second drain regions 216, 218 (e.g., by including an intervening conductive layer). Therefore, in some examples, the first and second drain contacts 208, 210 are not in contact with the first and second drain regions 216, 218, while still being at the same potential. The first and second ILD layers 222, 224 are insulators. In some examples, the first and second ILD layers 222, 224 are constructed of the same material (e.g., $SiO^2$). In other examples, the first and second ILD layers 222, 224 include additional and/or alternative materials.

In the illustrated example, the source region 214 has a first raised section 226. The first raised section 226 is in contact with the first source contact 204 in this example, but in other examples, an intervening conductive layer may be present. The source region 214 also includes a second raised section 228. The second raised section 228 is in contact with the second source contact 206 in this example, but in other examples, an intervening conductive layer may be present. In other examples, the source region 214 may not have raised sections 226, 228 for contact with the first and second source contacts 204, 206. In the illustrated example, the source region 214 further includes a central raised section 230 (disclosed in further detail herein) that extends upward (in a direction away from the substrate 202) from a lower section 231 of the source region 214. In other examples, the source region 214 may not include the central raised section 230.

In some examples, the source region 214, the first and/or second drain regions 216, 218, and/or the semiconductor material 232 includes group II-VI, III-V, or IV materials and further may include nitrogen, indium, germanium, indium antimonide, lead telluride, indium arsenide, indium phosphide, gallium arsenide, or gallium antimonide. In some examples, the source region 214 includes N doped indium gallium nitride (N+InGaN). The source region 214 may be doped with silicon (Si) or germanium (Ge), for example. In this example, the first and second drain regions 216, 218 also include N doped indium gallium nitride (N+InGaN). As such, the first and second drain regions 216, 218 may include the same material (N+InGaN) as the source region 214. However, in other examples, the first and second drain regions 216, 218 may include one or more different material(s) than the source region 214.

In the illustrated example, the first and second drain regions 216, 218 are located above (in a direction perpendicular to the substrate 202) the source region 214. In other words, the source region 214 is disposed below the first and second drain regions 216, 218 and above the substrate 202 (e.g., between the drain regions 216, 218 and the substrate 202). In the illustrated example, the FET 200 includes a layer or region of semiconductor material 232 between the drain regions 216, 218 and the source region 214. As such, the semiconductor material layer 232 is disposed above (in a direction perpendicular to the substrate 202) the source region 214, and the first and second drain regions 216, 218 are disposed above the semiconductor material layer 232. In some examples, the semiconductor material layer 232 includes gallium nitride (GaN). In the illustrated example, the semiconductor material layer 232 is divided into two sections by a gate 234. In particular, the gate 234 extends through the semiconductor material layer 232 to divide the semiconductor material layer 232 into a first semiconductor region 236 (on the left side of the gate 234 in FIG. 2A) and a second semiconductor region 238 (on the right side of the gate 234 in FIG. 2A). The gate 234 includes a gate metal 240 (sometimes referred to as a gate conductor) coated with a layer of gate oxide 242, disclosed in further detail herein.

In the illustrated example of FIG. 2A, the first semiconductor region 236 extends laterally (in a direction generally parallel to the substrate 202) from the gate 234. The first semiconductor region 236 is disposed on the source region 214. In some examples, a bottom 244 of a first end 246 of the first semiconductor region 236 (i.e., a first side of the first semiconductor region 236 facing in a direction toward the substrate 202) is in contact with the central raised section 230 of the source region 214. The first drain region 216 is disposed on (e.g., in contact with) a top 248 of the first semiconductor region 236 near a second end 250 of the first semiconductor region 236, opposite the first end 246. (The top 248 of the first semiconductor region 236 is a second side of the first semiconductor region 236 facing in a direction opposite the substrate 202.) Similarly, the second semiconductor region 238 extends laterally (in a direction generally parallel to the substrate 202) from the gate 234 in the opposite direction of the first semiconductor region 236. The second semiconductor region 238 is disposed on the source region 214. In some examples, a bottom 252 of a first end 254 of the second semiconductor region 238 is in contact with the central raised section 230 of the source region 214. The second drain region 218 is in contact with a top 256 of the second semiconductor region 238 near a second end 258 of the second semiconductor region 238, opposite the first end 254 of the second semiconductor region 238.

In the illustrated example, a first polarization layer 260 is disposed above the first semiconductor region 236 and extends between the first drain region 216 and the first end 246 (adjacent the gate 234). As a result, a first two-dimensional electron gas (2DEG) region 262 (depicted as a dotted line) is formed along the top 248 of the first semiconductor region 236 (e.g., in the top 3-4 nanometers of the first semiconductor region 236). The first 2DEG region 262 extends between the first drain region 216 and the first end 246. As such, the first 2DEG region 262 forms an extension of the first drain region 216 along the top 248 of the first semiconductor region 236. Similarly, a second polarization layer 264 is disposed above the second semiconductor region 238 that extends between the second drain region 218 and the first end 254 (adjacent the gate 234). Therefore, a second 2DEG region 266 is formed along the top 256 of the second semiconductor region 238 that extends between the second drain region 218 and the first end 254. The second 2DEG region 266 acts as an extension of the second drain region 218.

As disclosed above, the gate 234 includes the gate metal 240 and the gate oxide 242 at least partially covering the gate metal 240. The gate oxide 242 separates the gate metal 240 from the semiconductor material layer 232 and the source region 214. As such, the gate oxide 242 forms a barrier between the gate metal 240 and the semiconductor material layer 232 and the source region 214. In some examples, the gate oxide 242 is in contact with the semiconductor material layer 232 (along the first ends 246, 254 of the first and second semiconductor regions 236, 238) and the central raised section 230 of the source region 214. In the illustrated example, an additional region of oxide 267 is disposed in the central raised section 230 of the source region 214 below the gate 234, which further helps insulate the gate metal 240 from the material of the source region 214 (e.g., the region of oxide 267 acts as a spacer between the gate 234 and the source region 214). The region of oxide 267 may be the same material as the gate oxide 242 or a different material than the gate oxide 242. In other examples, the region of oxide 267 may not be included.

In the illustrated example, the gate contact 212 extends through the second ILD layer 224 to a top of the gate 234 (e.g., is in contact with the gate metal 240). When a voltage is applied to the gate metal 240 (e.g., when the gate 234 is activated), an electric field generated by the gate metal 240 forms a first channel 268 (depicted as a dotted line in FIG. 2A) (sometimes referred to as a charge channel or electron channel) on the first end 246 of the first semiconductor region 236, along the side of the gate 234, which extends in a somewhat vertical (non-horizontal) direction between the first 2DEG region 262 and the bottom 244 of the first semiconductor region 236 on the central raised section 230 of the source region 214. This first channel 268 allows current to flow along the first end 246 of the first semiconductor region 236 between the source region 214 and the first 2DEG region 262 (and, thus, to the first drain region 216). As a result, when the gate 234 is activated, current may flow in the source region 214, in the first channel 268, in the first 2DEG region 262, and in the first drain region 216. Therefore, the example FET 200 has a substantially vertical channel and a lateral drain that form an electrical flow path. In some examples, the vertical channel may be angled between 90 degrees(°) (completely vertical) to 45° (in either direction) depending on the etching step employed to form this vertical channel.

Similarly, a second channel 270 is formed on the first end 254 of the second semiconductor region 238, along the opposite side (i.e., the right side in FIG. 2A) of the gate 234. The second channel 270 extends between the second 2DEG region 266 on the top 256 of the second semiconductor region 238 and the bottom 252 of the second semiconductor region 238 on the central raised section 230 of the source region 214. Thus, the second channel 270 enables current to flow between the source region 214 and the second drain region 216.

Figure 2B:
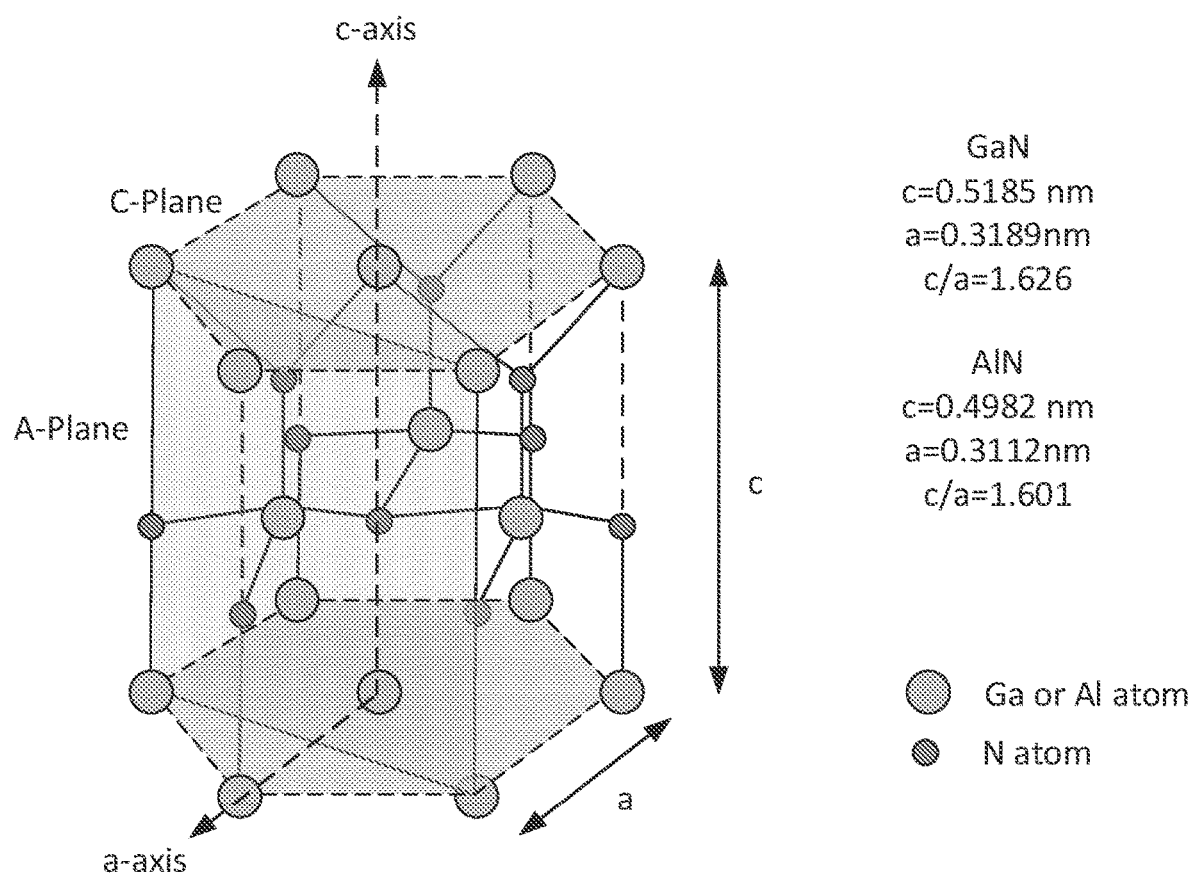
FIG. 2B illustrates an example gallium nitride (GaN) crystal structure that may be implemented as one or more materials of the example FET of FIG. 2A.

In the illustrated example, the gate 234, which is above the source region 214, has a tapered shape that decreases in width (from a larger cross-section to a smaller cross-section) in a direction towards the substrate 202 and the source region 214. The first end 246 of the first semiconductor region 236 and the first end 254 of the second semiconductor region 238 are, thus, tapered or angled at substantially the same angle as the sides of the gate 234. In other words, in some examples, the first ends 246, 254 are orientated in a direction that is not horizontal and not perpendicular to the substrate 202. It may be beneficial to have the first ends 246, 254 tapered or angled (compared to a vertical axis) in this manner, because the first and second channels 268, 270 (when the gate 234 is activated) are then not limited to the A-plane of the GaN crystal structure, but instead are formed in C-planes of the gallium nitride (GaN) crystal. As shown in FIG. 2B, the GaN crystal structure includes a vertical A-plane and a horizontal C-plane. A C-plane of the GaN crystal structure has a higher tendency to retain electrons than an A-plane of the GaN crystal structure. As such, by using a tapered design, a lower voltage is required to create the first and second channels 268, 270 than would be required if the channels were completely formed in the A-plane. In other words, in some examples, the first and second channels 268, 270 are non-horizontally oriented and non-vertically oriented. In some examples, the first ends 246, 254 of the first and second semiconductor regions 236, 238 are vertically disposed at an angle of about 45°-135° degrees. However, in other examples, the first ends 246, 254 of the first and second semiconductor regions 236, 238 may be angled at a greater or smaller angle. In still other examples, the first ends 246, 254 of the first and second semiconductor regions 236, 238 may be completely vertical (e.g., in a direction that is perpendicular to the substrate 202).

As can be seen in FIG. 2A, the first and second semiconductor regions 236, 238 extend laterally (in directions that are opposite to one another but generally parallel to the substrate 202) from the central raised section 230 of the source region 214. As such, a relatively large section (e.g., a majority) of the first and second semiconductor regions 236, 238 are disposed (e.g., cantilevered) over the first ILD layer 222. For example, a first portion of the bottom 244 of the first semiconductor region 236 near the first end 246 is in contact with the source region 214, and a second portion of the bottom 244 of the first semiconductor region 236 near the second end 250 is in contact with the ILD of the first ILD layer 222 (which is disposed between the lower section 231 of the source region 214 and the first semiconductor region 236). In some examples, less than about 20% of the bottom 244 of the first semiconductor region 236 is in contact with the source region 214. In other examples, more or less of the bottom 244 of the first semiconductor region 236 may be in contact with the source region 214. As a result, the amount of defects formed in the crystalline structures of the first and second semiconductor regions 236, 238 is substantially reduced or eliminated compared to known FETs that utilize crystal semiconductor materials. In particular, defects, such as dislocations or cracks, occur vertically in crystalline material such as GaN and are caused by the interface between to two crystalline type materials. For instance, referring briefly to FIG. 1, the semiconductor material layer 110 is in contact with the substrate 102. As a result, vertical defects may occur in the semiconductor material layer 110 because of the interfacing crystalline materials. However, in the architecture of FIG. 2A, the portions of the first and second semiconductor regions 236, 238 extending beyond (to the left and right) of the central raised section 230 are disposed on the first ILD layer 222 (a non-crystalline material), not on another crystalline structure such as a silicon substrate. As such, no vertical defects are formed in these portions of the first and second semiconductor regions 236, 238. However, defects may still occur in the portions of the semiconductor regions 236, 238 above the top of the central raised section 230 of the source region 214. In other examples, the top of the raise section 230 of the source region 214 may be wider or narrow and, thus, may be in contact with more or less of the bottom of the semiconductor material layer 232.

Further, the generally vertical arrangement of the FET 200 provides enhanced electrical isolation in high voltage applications. Such isolation results in less power leakage/dissipation and, thus, increased performance. For example, in the illustrated example of FIG. 2A, the source region 214, which is between the drain regions 216, 218 and the substrate 202, separates or isolates the drain regions 216, 218 from the substrate 202 (e.g., the source region 214 forms a layer between the first and second drain regions 216, 218 and the substrate 202). As such, the source region 214 acts to shield the first and second drain regions 216, 218 from the substrate 202, thereby reducing parasitic leakage (i.e., current loss) that might otherwise occur between a drain and a substrate. Therefore, leakage between the drain regions 216, 218 and the substrate 202 is reduced (e.g., minimized) or eliminated.

Additionally, the vertical arrangement of the FET 200 results in reduced or eliminated parasitic capacitance between the drain regions 216, 218 and the source region 214 ($C_{drain-source}$), and between the drain regions 216, 218 and the substrate 202 ($C_{drain-substrate}$). As disclosed above, the source region 214 shields the first and second drain regions 216, 218 from the substrate 202. Also, the K constant of the first ILD layer 222 is smaller than then K constant of the source region 214. For example, the first ILD layer 222 may have a K constant of 3.9, whereas the source region 214 (N+InGaN) may have a K constant of 9.5. The first and second drain regions 216, 218 are separated from the source region 214 by the first ILD layer 222. This separation reduces parasitic capacitance. Therefore, the example FET 200 is more efficient than known high voltage FETs.

Another advantage of the example FET 200 illustrated in FIG. 2A is the ability to accurately control the length of the first and second channels 268, 270. For example, the lengths of the first and second channels 268, 270 depend on the height of the semiconductor material layer 232. The semiconductor material layer 232 may be formed via epitaxial growth. In such a process, the gallium nitride (GaN) crystalline structure grows upward (in a direction away from the substrate) in small increments (e.g., one atom at a time). Because of the small increments, the epitaxial growth can be ceased at a desired height. The height defines the lengths of the channels. As such, the process can be used to control the lengths of the first and second channels 268, 270 on a nanometer scale (or even smaller), thereby providing finer control of the channel length as compared to the process used in the known high voltage FET 100 (FIG. 1).

Also, as seen in FIG. 2A, a zero or near zero distance is achieved between the source region 214 and the gate 234. In FETs, a greater distance between a source and a gate creates resistance, sometimes referred to as $R_{on}$ (which is the resistance (in ohms) when the FET is on). Therefore, by using the architecture shown in FIG. 2A, a zero or near zero distance can be achieved, which reduces or eliminates such resistance and, thus, enables improved $R_{on}$ of the FET 200. Further, in the illustrated example, the gate 234 is self-aligned, which enables current to flow directly from the source region 214 into the channels 268, 270 without added tip resistance (which is commonly seen in CMOS transistors where current entering/exiting the channel must flow through a tip (under a spacer) before entering/exiting the source).

In the illustrated example of FIG. 2A, a portion of the gate contact 212 extends laterally beyond the gate 234 on each side. These lateral extensions may be referred to as a field plate. In particular, the bottom of the gate contact 212 is wider than a top of the gate 234 (such that a portion of the gate contact 212 is above the polarization layers 260, 264). As such, when the gate 234 is activated (e.g., when a voltage is applied to the gate metal 240 via the gate contact 212), the gate contact 212 creates an electric field in the first and second 2DEG regions 262, 266 (which are at least partially below the overhanging sections of the gate contact 212) to help distribute the electrons in the first and second 2DEG regions 262, 266 (and, thus, in the drains). This electric field reduces stress concentration areas that would otherwise exist, such as at the point between the first 2DEG region 262 and the first channel 268, and at the point between the second 2DEG region 266 and the second channel 270. In other words, the overhanging portion(s) of the gate contact 212 help distribute the charges into the respective first and second 2DEG regions 262, 266 when the gate 234 is activated. In the known high voltage FET 100 of FIG. 1, to form a field plate, the gate contact would have to be extended over the first 2DEG region 262. However, by doing this, the gate contact becomes closer to the source 104, which results in parasitic capacitance (which may, for example, result in RF leakage) between the gate and the source. In the example FET 200 of FIG. 2A, the source region 214 is well below the gate contact 212 and separated by other layers or regions. As such, the gate contact 212 can extend beyond the gate 234 without causing parasitic capacitance problems like in the known FET 100.

While in the illustrated example of FIG. 2A the FET 200 includes two semiconductor regions, two drain regions, two drain contacts, and two source contacts, in other examples, the FET 200 may be similarly constructed with only one semiconductor region, one drain region, one source contact, and one drain contact. For example, the FET 200 may include only the components on the left half of FIG. 2A, such as the first source contact 204, the first semiconductor region 236, the first drain region 216, and the first drain contact 208. The resulting FET could operate substantially the same as the symmetrical FET illustrated in FIG. 2A.

FIGS. 3A-3J are detailed cross-sectional views depicting the example FET 200 of FIG. 2A at different stages of manufacture. The example processes shown in these figures are only examples and any appropriate sequence of fabrication processes such as etching, deposition, epitaxial growth, etc. may be used. Further, any appropriate materials, layers, stacks, and or conductors may be used.

Figure 3A:
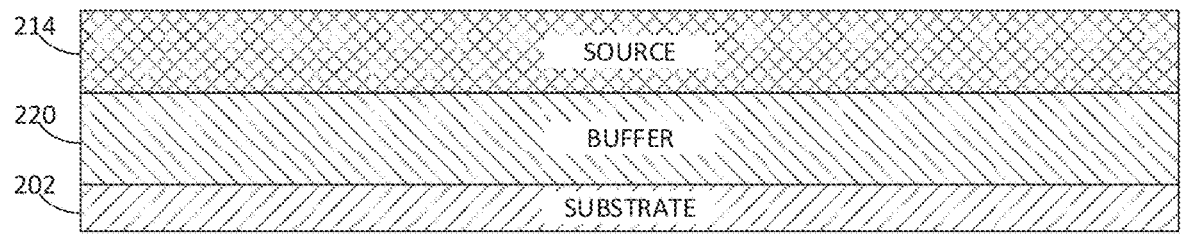
FIGS. 3A-3J illustrate the example FET of FIG. 2A at different times/stages of fabrication.

Turning to FIG. 3A, the buffer layer 220 is grown, via an epitaxial growth process, on the substrate 202. In some examples, the buffer layer 220 includes three layers: a bottom layer of aluminum nitride (AlN) on the substrate 202, a middle layer of aluminum gallium nitride (AlGaN) on the aluminum nitride (AlN) layer, and a top layer of gallium nitride (GaN) on the aluminum gallium nitride (AlGaN) layer. Then, the source region 214 is grown, via another epitaxial growth process, on the buffer layer 220 (e.g., onto the top layer of gallium nitride (GaN)). In some examples, the source region 214 includes N doped indium gallium nitride (N+InGaN).

Figure 3B:
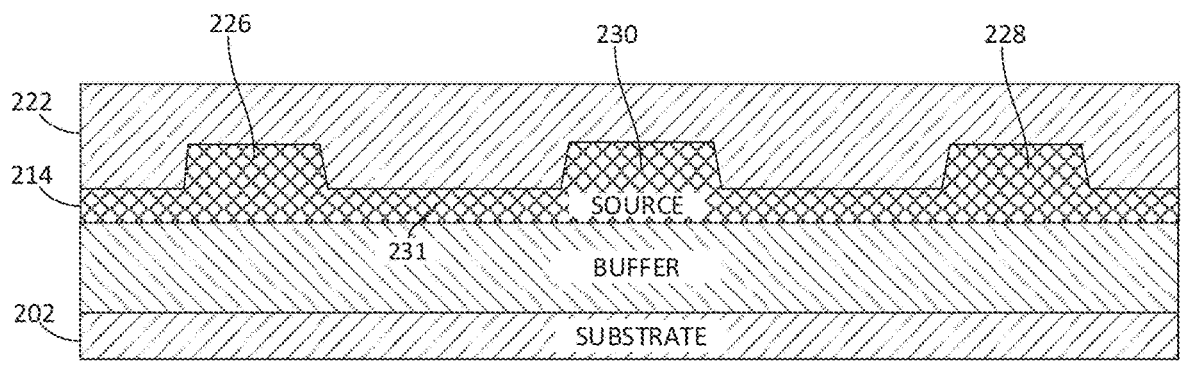

Subsequently, as illustrated in FIG. 3B, the first and second raised sections 226, 228 and the central raised section 230 are formed in the source region 214. In some examples, the first and second raised sections 226, 228 and the central raised section 230 are formed by removing portions of the source region 214 (e.g., via selectively etching, etching using a mask layer, etc.). The resulting shape of the source region 214 includes the lower section 231 and the raised sections 226, 228, 230, which extend from the lower section 231 in a direction away from (e.g., perpendicular to) the substrate 202. Then, ILD is deposited onto the source region 214 to form the first ILD layer 222. In some examples, a planarizing process is performed to smooth the top of the first ILD layer 222.

Figure 3C:
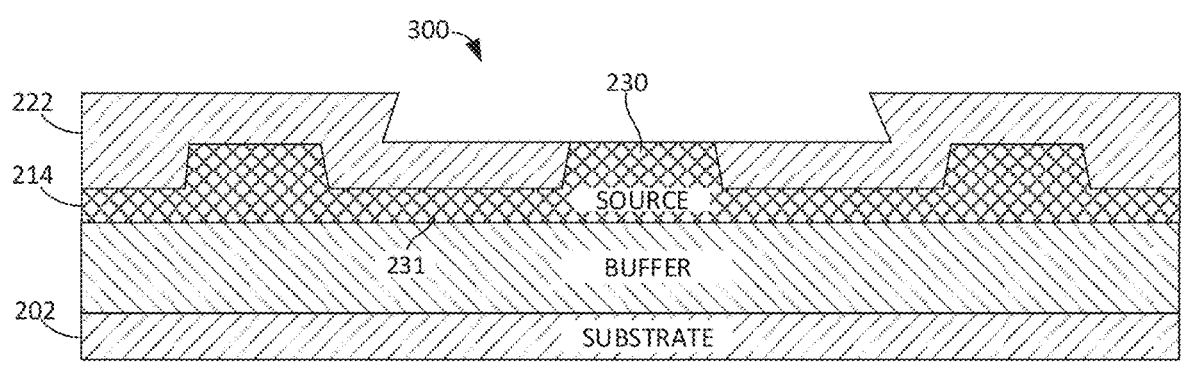

Next, as illustrated in FIG. 3C, a recess 300 is formed in the first ILD layer 222. The recess 300 extends down into the first ILD layer 222 (in a direction toward the substrate 202) such that the top of the central raised section 230 of the source region 214 is exposed. The recess 300 extends laterally (to the left and right in FIG. 3C) beyond the central raised section 230 and over the lower section 231 of the source region 214. The recess 300 may be formed by etching or patterning, for example. In the illustrate example, the side walls of the recess 300 are angled inward. However, in other examples, the side walls may be vertical or angled outward.

Figure 3D:
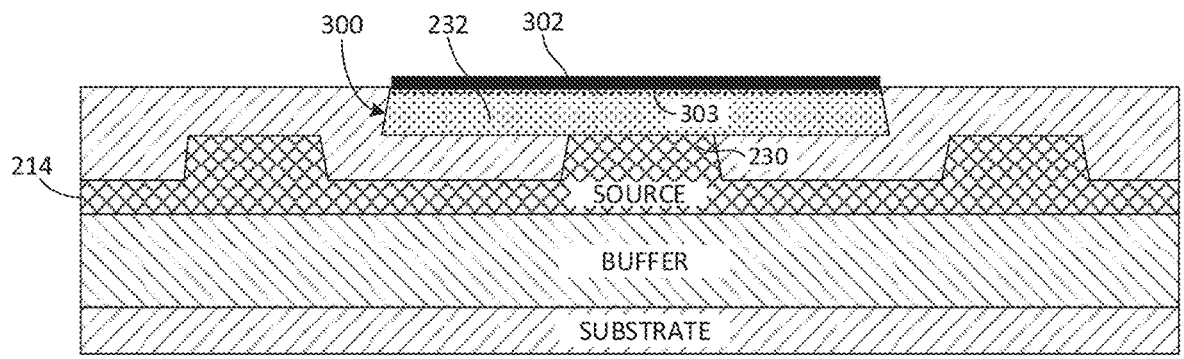

Then, as illustrated in FIG. 3D, the semiconductor material layer 232 is grown, via an epitaxial growth process, in the recess 300. In particular, the gallium nitride (GaN) of the semiconductor material layer 232 grows upward (vertically) and laterally (horizontally, sometimes referred to as lateral epitaxial overgrowth) from the central raised section 230 of the source region 214, which may include N doped indium gallium nitride (N+InGaN). The epitaxial growth may be ceased at a desired height, which defines the length of the channels (e.g., the first and second channel 268, 270). Further, a polarization layer 302 (which becomes the first and second polarization layers 260, 264) is deposited and/or layered onto the semiconductor material layer 232. The interaction between the semiconductor material layer 232 and the polarization layer 302 forms a 2DEG region 303 (shown as a dotted line) in the top of the semiconductor material layer 232.

Figure 3E:
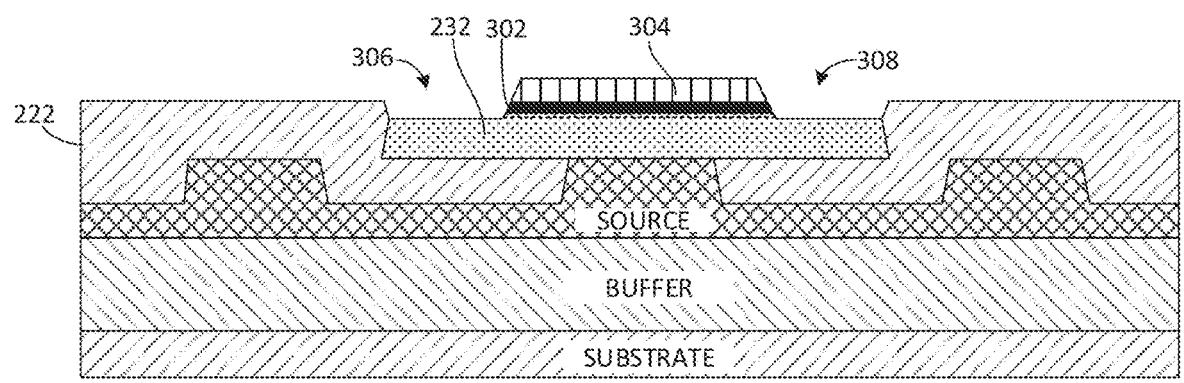

In FIG. 3E, a mask 304 is deposited onto a top of the polarization layer 302. The mask 304 is shorter than a length of the polarization layer 302. Then, first and second drain trenches 306, 308 are formed (e.g., via etching) through the polarization layer 302 and into the top of the semiconductor material layer 232. In some examples, more ILD is deposited to increase the height of the first ILD layer 222.

Figure 3F:
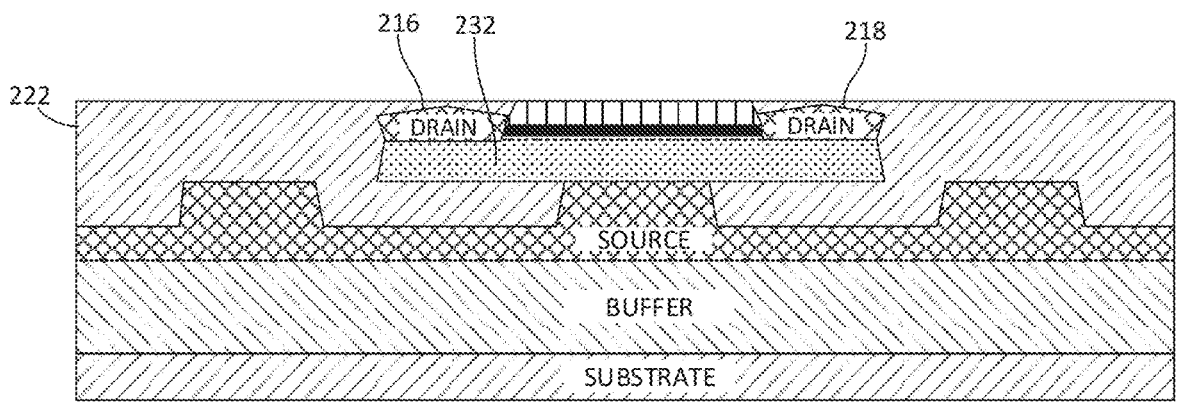

Turning to FIG. 3F, the first drain region 216 is grown, via an epitaxial growth process, in the first drain trench 306 on the semiconductor material layer 232. The first drain region 216 is located at or near one end of the semiconductor material layer 232 (e.g., at or near the end that becomes the second end 250 of the first semiconductor region 236). Similarly, the second drain region 218 is grown, via an epitaxial growth process, in the second drain trench 308 on the semiconductor material layer 232. The second drain region 218 is located near the opposite end of the semiconductor material layer 232 (e.g., at or near the end that becomes the second end 258 of the second semiconductor region 238). Then, more ILD may be deposited to cover the first and second drain regions 216, 218 and increase the height of the first ILD layer 222.

Figure 3G:
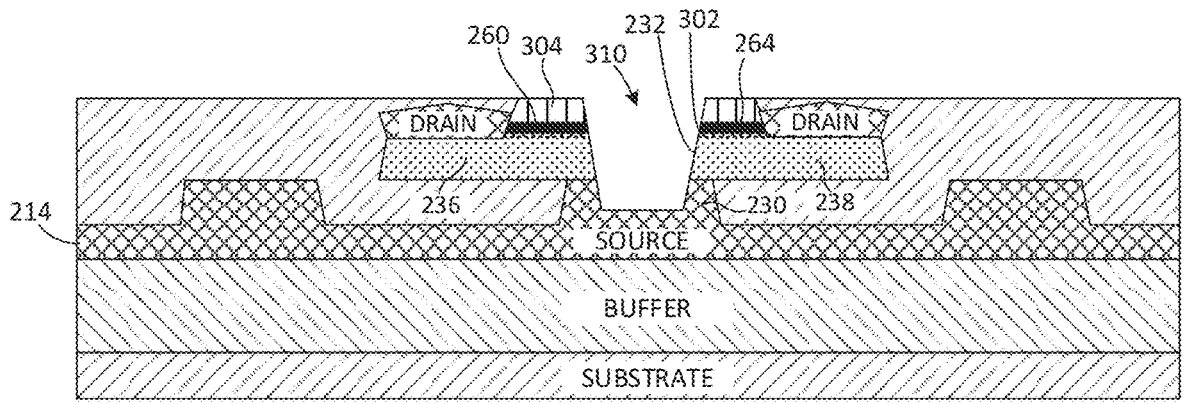

As illustrated in FIG. 3G, a gate recess 310 is formed (e.g., etched) through the mask 304, the polarization layer 302, the semiconductor material layer 232, and into the central raised section 230 of the source region 214. In the illustrated example, the gate recess 310 is tapered or conical, which decreases in width or cross-section in a direction toward the source region 214. The gate recess 310 may be formed via an etch profile. In some examples, as the etching process occurs, the mask 304 protecting the masked regions is erode from the sides, thereby resulting in the unmasked region widening over time. The gate recess 310 divides the semiconductor material layer 232 into the first semiconductor region 236 and the second semiconductor region 238. The gate recess 310 also divides the polarization layer 302 into the first polarization layer 260 and the second polarization 264.

Figure 3H:
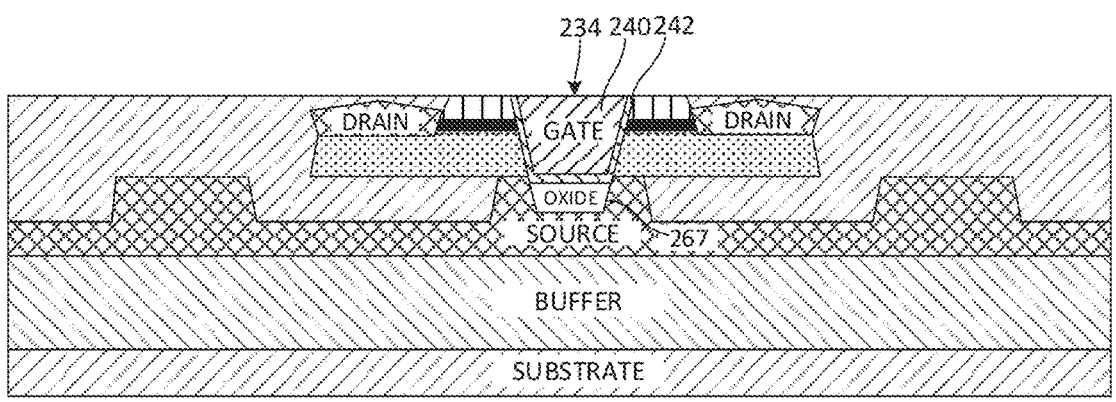

As shown in FIG. 3H, the region of oxide 267 is deposited into the gate recess 310. In some examples depositing the region of oxide 267 leaves a thin layer of oxide on the walls of the gate recess 310, which can be removed (e.g., via etching). Then, the gate 234 is formed on top of the region of oxide 267 in the gate recess 310. In some examples, the gate oxide 242 is first deposited onto the walls of the gate recess 310 as well as on top of the region of oxide 267. Then, the gate metal 240 is deposited into the gate recess 310, such that the gate oxide 242 separates the gate metal 240 from the source region 214 and the semiconductor regions 236, 238.

Figure 3I:
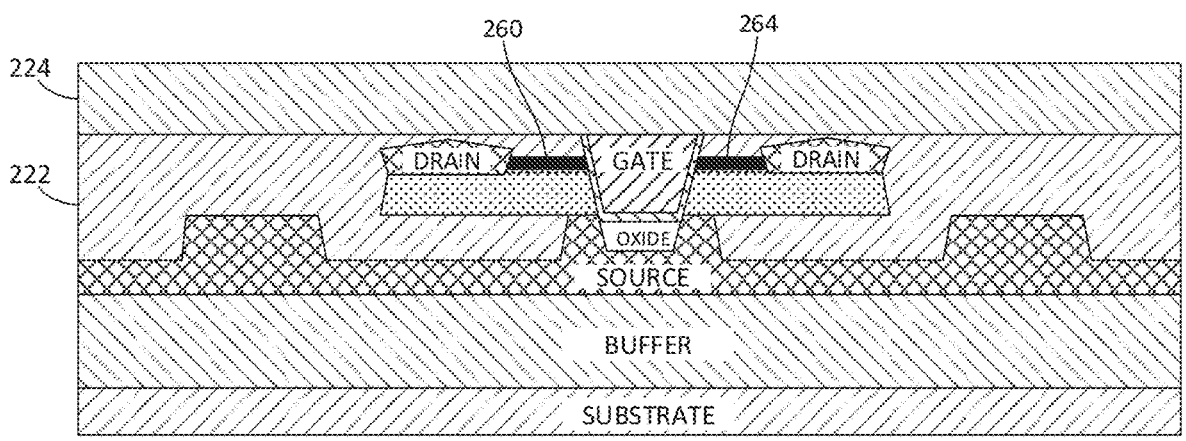

As illustrated in FIG. 3I, the mask 304 is removed to expose the sides of the gate 234 and the tops of the first and second polarization layers 260, 264. More ILD is added to cover the top of the first and second polarization layers 260, 264. Then, more ILD is deposited and/or layered onto the top of the first ILD layer 222 to form the second ILD layer 224.

Figure 3J:
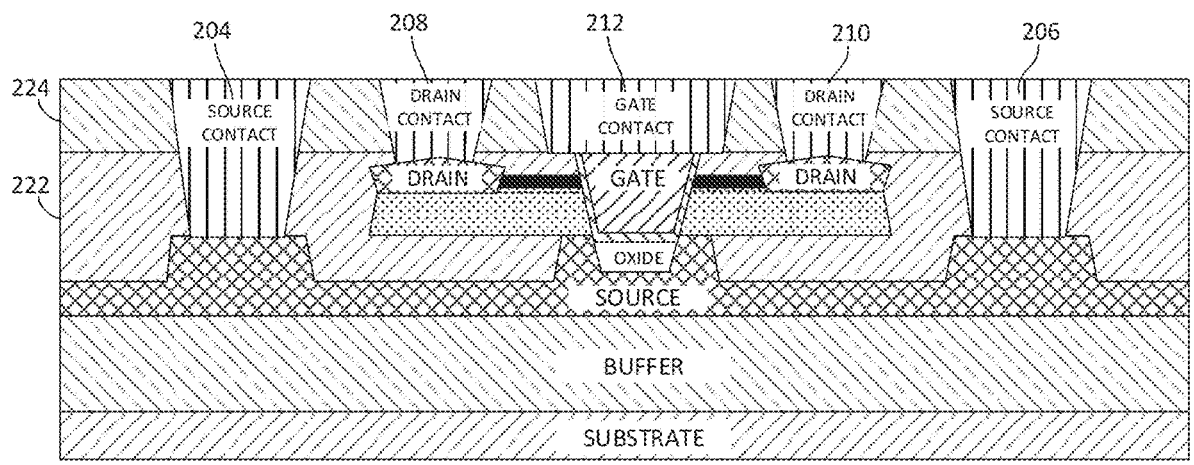

Next, as illustrated in FIG. 3J, contact trenches are formed through the first and/or second ILD layers 222, 224. Contact metal is deposited into the trenches to from the first source contact 204, the second source contact 206, the first drain contact 208, the second drain contact 210, and the gate contact 212.

Figure 4:
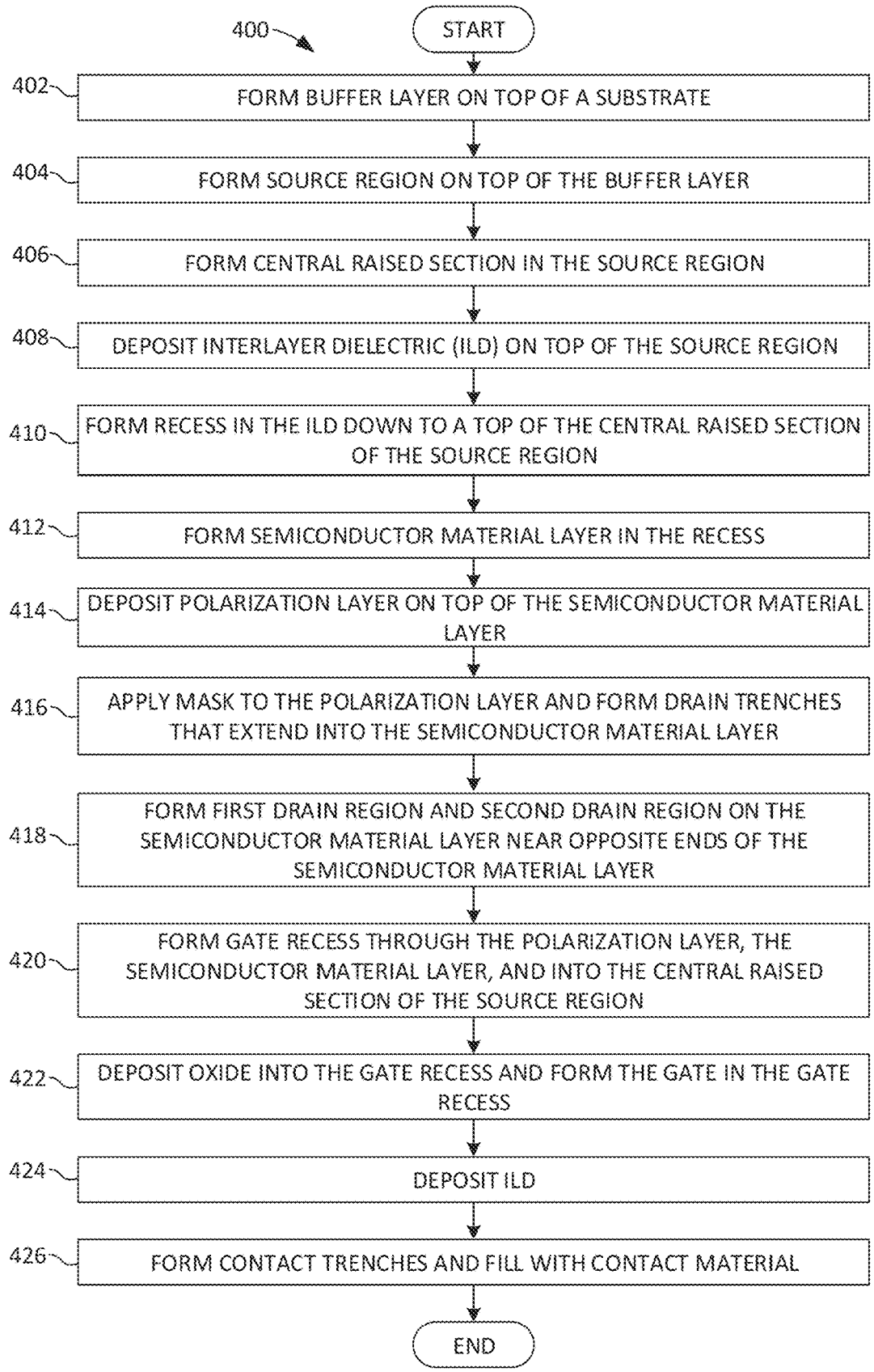
FIG. 4 is a flowchart of an example method to manufacture the example FET of FIG. 2A.

FIG. 4 is a flowchart of an example method 400 to manufacture the example FET 200 of FIG. 2A and described in connection with the process illustrated in FIGS. 3A-3J. At block 402, the buffer layer 220 is formed on top of the substrate 202. At block 404, the source region 214 is formed on top of the buffer layer 220, which is depicted in FIG. 3A. As such, the source region 214 is formed above the substrate 202. In some examples, the buffer layer 220 and/or the source region 214 are grown via an epitaxial growth process. In other examples, the buffer layer 220 and/or the source region 214 may be formed via another deposition or layering process.

At block 406, the central raised section 230 is formed in the source region 214, as shown in FIG. 3B. The central raised section 230 may be formed by etching the source region 214 (e.g., by creating indentations in the source region 214 to form the central raised section 230). Additionally, in some examples, the first and second raised sections 226, 228 are formed in the source region 214.

At block 408, ILD is deposited above the top of the source region 214 to form the first ILD layer 222, as shown in FIG. 3B. At block 410, the recess 300 is formed in the first ILD layer 222 down to a top of the central raised section 230 of the source region 214, such as shown in FIG. 3C.

At block 412, the semiconductor material layer 232 (e.g., the first and second semiconductor regions 236, 238) is formed in the recess 300 (and, thus, above the semiconductor material layer 232), as shown in FIG. 3D. In some examples, the semiconductor material layer 232 is formed in the recess 300 via epitaxial growth, by growing the gallium nitride (GaN) starting on the top of the central raise section 230 of the source region 214. The gallium nitride (GaN) crystal grows laterally (parallel to the substrate 202) and vertically (in a direction perpendicular to the substrate 202). As a result, in some examples, the source region 214 is in contact with a bottom of the semiconductor material layer 232 (a side of the semiconductor material layer 232 facing the substrate 202). The growth may be stopped at any desired height and, thus, can be used to define the length of the channels 268, 270. At block 414, the polarization layer 302 is formed on (e.g., deposited onto) the top of the semiconductor material layer 232, as shown in FIG. 3D.

At block 416, the mask 304 is applied to the top of the polarization layer 302 and the drain trenches 306, 308 are formed, which extend into the semiconductor material layer 232, as shown in FIG. 3E.

At block 418, the first and second drain regions 216, 218 are formed in the first and second drain trenches 306, 308, respectively, on the semiconductor material layer 232 near the ends of the semiconductor material layer 232, as shown in FIG. 3F. In some examples, the first and second drain regions 216, 218 are epitaxially grown on the semiconductor material layer 232. In some examples, the source region 214, the first and/or second drain regions 216, 218, and/or the semiconductor material 232 includes group II-VI, III-V, or IV materials and further may include nitrogen, indium, germanium, indium antimonide, lead telluride, indium arsenide, indium phosphide, gallium arsenide, or gallium antimonide.

At block 420, the gate recess 310 is formed (e.g., etched). The gate recess 310 extends through the polarization layer 302, through the semiconductor material layer 232, and into the central raised section 230 of the source region 214, as shown in FIG. 3G. The gate recess 310 divides the semiconductor material layer 232 into the first semiconductor region 236 (on the left of the gate recess 310) and the second semiconductor region 238 (on the right of the gate recess 310). At block 422, the region of oxide 267 is deposited into the gate recess 310 and the gate 234 is formed in the gate recess 310, as shown in FIG. 3H. The gate 234 may be formed by filling the gate recess 310 with the gate metal 240 and the gate oxide 242.

At block 424, the second ILD layer 224 is deposited, as shown in FIG. 3I. At block 426, the contact trenches are formed in the first and/or second ILD layers 222, 224 (e.g., via an etching process) and contact material (e.g., dielectric, metal, etc.) is deposited into the contact trenches to form the first source contact 204, the second source contact 206, the first drain contact 208, the second drain contact 210, and the gate contact 212. Thereafter, the example method 400 ends.

Although the example method 400 is described with reference to the flowchart illustrated in FIG. 4, many other methods of manufacturing the example FET 200 of FIG. 2 may alternatively be used. For example, the order of execution of the blocks may be changed, and/or some of the blocks described may be changed, eliminated, or combined. Similarly, additional operations may be included in the manufacturing process before, in between, or after the blocks shown in FIG. 4.

The example FET 200 disclosed herein may be included in any suitable electronic component. FIGS. 5-9 illustrate various example apparatus that may include any of the example FETs disclosed herein.

Figure 5:
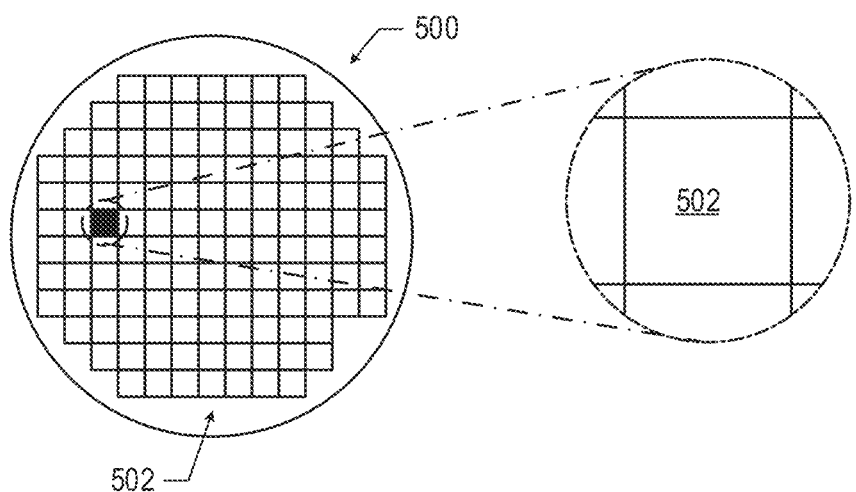
FIG. 5 is a top view of an example wafer and example dies that may include an FET, such as the example FET of FIG. 2A, in accordance with any of the examples disclosed herein.

FIG. 5 is a top view of an example wafer 500 and example dies 502 that may include one or more of the example FET(s) 200, or may be included in an integrated circuit (IC) package whose substrate includes one or more example FET(s) 200 (e.g., as discussed below with reference to FIG. 7) in accordance with any of the examples disclosed herein. The wafer 500 may be composed of semiconductor material and may include one or more dies 502 having IC structures formed on a surface of the wafer 500. Each of the dies 502 may be a repeating unit of a semiconductor product that includes any suitable IC. After the fabrication of the semiconductor product is complete, the wafer 500 may undergo a singulation process in which the dies 502 are separated from one another to provide discrete "chips" of the semiconductor product. The die 502 may include one or more of the example FET(s) 200 (e.g., as discussed below with reference to FIG. 6), one or more transistors (e.g., some of the transistors 640 of FIG. 6, discussed below) and/or supporting circuitry to route electrical signals to the transistors, as well as any other IC components. In some examples, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device (e.g., the processing device 902 of FIG. 9) or other logic that is configured to store information in the memory devices or execute instructions stored in the memory array.

Figure 6:
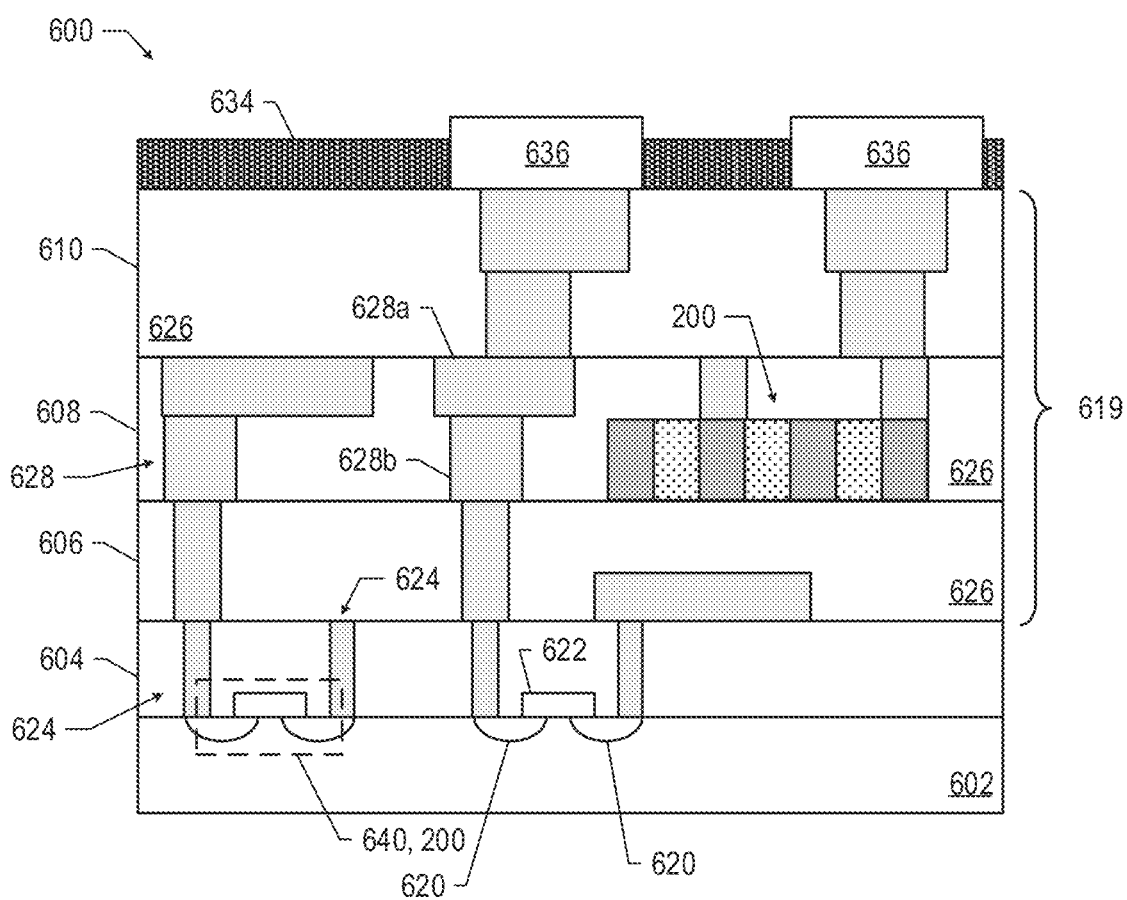
FIG. 6 is a cross-sectional side view of an example integrated circuit (IC) device that may include an FET, such as the example FET of FIG. 2A, in accordance with any of the examples disclosed herein.

FIG. 6 is a cross-sectional side view of an IC device 600 that may include one or more of the example FET(s) 200, or may be included in an IC package whose substrate includes one or more of the example FET(s) 200 (e.g., as discussed below with reference to FIG. 7), in accordance with any of the examples disclosed herein. One or more of the IC devices 600 may be included in one or more dies 502 (FIG. 5). The IC device 600 may be formed on a substrate 602 (e.g., the wafer 500 of FIG. 5) and may be included in a die (e.g., the die 502 of FIG. 5). The substrate 1602 may be a semiconductor substrate composed of semiconductor material systems including, for example, n-type or p-type materials systems (or a combination of both). The substrate 602 may include, for example, a crystalline substrate formed using a bulk silicon or a silicon-on-insulator (SOI) substructure. In some examples, the substrate 602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 602. Although a few examples of materials from which the substrate 602 may be formed are described here, any material that may serve as a foundation for an IC device 600 may be used. The substrate 602 may be part of a singulated die (e.g., the dies 502 of FIG. 5) or a wafer (e.g., the wafer 500 of FIG. 5).

The IC device 600 may include one or more device layers 604 disposed on the substrate 602. The device layer 604 may include features of one or more transistors 640 (e.g., metal oxide semiconductor field-effect transistors (MOSFETs)) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may include a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 640 along the source-channel-drain direction, the gate electrode may include a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may include a combination of U-shaped structures and planar, non-U-shaped structures. For example, the gate electrode may include one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching. In some examples, a plurality of spacer pairs may be used; for instance, two pairs, three pairs, or four pairs of sidewall spacers may be formed on opposing sides of the gate stack.

The S/D regions 620 may be formed within the substrate 602 adjacent to the gate 622 of each transistor 640. The S/D regions 620 may be formed using an implantation/diffusion process or an etching/deposition process, for example. In the former process, dopants such as boron, aluminum, antimony, phosphorous, or arsenic may be ion-implanted into the substrate 602 to form the S/D regions 620. An annealing process that activates the dopants and causes them to diffuse farther into the substrate 602 may follow the ion-implantation process. In the latter process, the substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 620 may be formed using one or more alternate semiconductor materials such as germanium or a group III-V material or alloy. In further examples, one or more layers of metal and/or metal alloys may be used to form the S/D regions 620.

In some examples, the device layer 604 may include one or more of the example (s) 200, in addition to or instead of transistors 640. FIG. 6 illustrates a single FET 200 in the device layer 604 for illustration purposes, but any number and structure of the example FET 200 may be included in a device layer 604. The FET 200 included in a device layer 604 may be referred to as a "front end" device. In some examples, the IC device 600 may not include any front end FET 200. One or more of the example FET(s) 200 in the device layer 604 may be coupled to any suitable other ones of the devices in the device layer 604, to any devices in the metallization stack 619 (discussed below), and/or to one or more of the conductive contacts 636 (discussed below).

Electrical signals, such as power and/or input/output (I/O) signals, may be routed to and/or from the devices (e.g., transistors 640 and/or the example FET(s) 200) of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an "ILD stack") 619 of the IC device 600. In some examples, one or more of the example FET(s) 200 may be disposed in one or more of the interconnect layers 606-610, in accordance with any of the techniques disclosed herein. FIG. 6 illustrates a single example FET 200 in the interconnect layer 608 for illustration purposes, but any number and structure of the example FET 200 may be included in any one or more of the layers in a metallization stack 619. An example FET 200 included in the metallization stack 619 may be referred to as a "back-end" device. In some examples, the IC device 600 may not include any back-end FET 200; in some examples, the IC device 600 may include both front- and back-end FET 200. One or more of the example FET(s) 200 in the metallization stack 619 may be coupled to any suitable ones of the devices in the device layer 604, and/or to one or more of the conductive contacts 636 (discussed below).

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, examples of the present disclosure include IC devices having more or fewer interconnect layers than depicted.

In some examples, the interconnect structures 628 may include lines 628a and/or vias 628b filled with an electrically conductive material such as a metal. The lines 628a may be arranged to route electrical signals in a direction of a plane that is substantially parallel with a surface of the substrate 602 upon which the device layer 604 is formed. For example, the lines 628a may route electrical signals in a direction in and out of the page from the perspective of FIG. 6. The vias 628b may be arranged to route electrical signals in a direction of a plane that is substantially perpendicular to the surface of the substrate 602 upon which the device layer 604 is formed. In some examples, the vias 628b may electrically couple lines 628a of different interconnect layers 606-610 together.

The interconnect layers 606-610 may include a dielectric material 626 disposed between the interconnect structures 628, as shown in FIG. 6. In some examples, the dielectric material 626 disposed between the interconnect structures 628 in different ones of the interconnect layers 606-610 may have different compositions; in other examples, the composition of the dielectric material 626 between different interconnect layers 606-610 may be the same.

A first interconnect layer 606 (referred to as Metal 1 or "M1") may be formed directly on the device layer 604. In some examples, the first interconnect layer 606 may include lines 628a and/or vias 628b, as shown. The lines 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some examples, the second interconnect layer 608 may include vias 628b to couple the lines 628a of the second interconnect layer 608 with the lines 628a of the first interconnect layer 606. Although the lines 628a and the vias 628b are structurally delineated with a line within each interconnect layer (e.g., within the second interconnect layer 608) for the sake of clarity, the lines 628a and the vias 628b may be structurally and/or materially contiguous (e.g., simultaneously filled during a dual-damascene process) in some examples.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some examples, the interconnect layers that are "higher up" in the metallization stack 619 in the IC device 600 (i.e., further away from the device layer 604) may be thicker.

The IC device 600 may include a solder resist material 634 (e.g., polyimide or similar material) and one or more conductive contacts 636 formed on the interconnect layers 606-610. In FIG. 6, the conductive contacts 636 are illustrated as taking the form of bond pads. The conductive contacts 636 may be electrically coupled with the interconnect structures 628 and configured to route the electrical signals of the transistor(s) 640 to other external devices. For example, solder bonds may be formed on the one or more conductive contacts 636 to mechanically and/or electrically couple a chip including the IC device 600 with another component (e.g., a circuit board). The IC device 600 may include additional or alternate structures to route the electrical signals from the interconnect layers 606-610; for example, the conductive contacts 636 may include other analogous features (e.g., posts) that route the electrical signals to external components.

Figure 7:
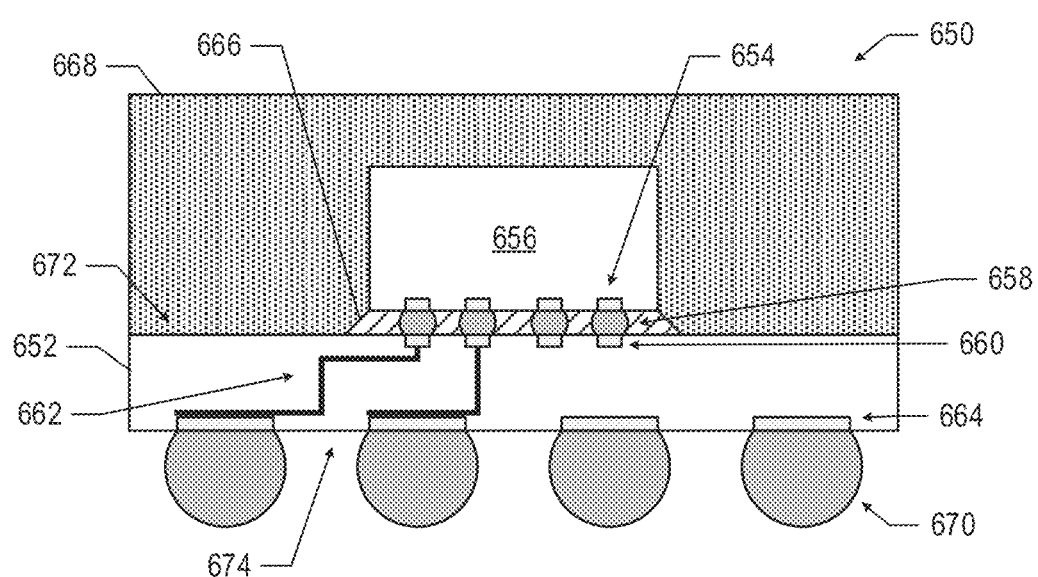
FIG. 7 is a cross-sectional side view of an example IC package that may include an FET, such as the example FET of FIG. 2A, in accordance with any of the examples disclosed herein.

FIG. 7 is a cross-sectional view of an example IC package 650 that may include one or more of the example FET(s) 200. The package substrate 652 may be formed of a dielectric material, and may have conductive pathways extending through the dielectric material between the face 672 and the face 674, or between different locations on the face 672, and/or between different locations on the face 674. These conductive pathways may take the form of any of the interconnects 628 discussed above with reference to FIG. 6. FIG. 7 illustrates a single FET 200 in the package substrate 652, but this number and location of the example FET(s) 200 in the IC package 650 is simply illustrative, and any number of the example FET(s) 200 (with any suitable structure) may be included in a package substrate 652. In some examples, no FET 200 may be included in the package substrate 652.

The IC package 650 may include a die 656 coupled to the package substrate 652 via conductive contacts 654 of the die 656, first-level interconnects 658, and conductive contacts 660 of the package substrate 652. The conductive contacts 660 may be coupled to conductive pathways 662 through the package substrate 652, allowing circuitry within the die 656 to electrically couple to various ones of the conductive contacts 664 or to the example FET 200 (or to other devices included in the package substrate 652, not shown). The first-level interconnects 658 illustrated in FIG. 7 are solder bumps, but any suitable first-level interconnects 658 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 666 may be disposed between the die 656 and the package substrate 652 around the first-level interconnects 658, and a mold compound 668 may be disposed around the die 656 and in contact with the package substrate 652. In some examples, the underfill material 666 may be the same as the mold compound 668. Example materials that may be used for the underfill material 666 and the mold compound 668 are epoxy mold materials, as suitable. Second-level interconnects 670 may be coupled to the conductive contacts 664. The second-level interconnects 670 illustrated in FIG. 7 are solder balls (e.g., for a ball grid array arrangement), but any suitable second-level interconnects 670 may be used (e.g., pins in a pin grid array arrangement or lands in a land grid array arrangement). The second-level interconnects 670 may be used to couple the IC package 650 to another component, such as a circuit board (e.g., a motherboard), an interposer, or another IC package, as known in the art and as discussed below with reference to FIG. 8.

In FIG. 7, the IC package 650 is a flip chip package, and includes the example FET 200 in the package substrate 652. The number and location of the example FET(s) 200 in the package substrate 652 of the IC package 650 is simply illustrative, and any number of the example FET(s) 200 (with any suitable structure) may be included in a package substrate 652. In some examples, no FET 200 may be included in the package substrate 652. The die 656 may take the form of any of the examples of the die 502 discussed herein (e.g., may include any of the examples of the IC device 600). In some examples, the die 656 may include one or more of the example FET(s) 200 (e.g., as discussed above with reference to FIG. 5 and FIG. 6); in other examples, the die 656 may not include any FET 200.

Although the IC package 650 illustrated in FIG. 7 is a flip chip package, other package architectures may be used. For example, the IC package 650 may be a ball grid array (BGA) package, such as an embedded wafer-level ball grid array (eWLB) package. In another example, the IC package 650 may be a wafer-level chip scale package (WLCSP) or a panel fanout (FO) package. Although a single die 656 is illustrated in the IC package 650 of FIG. 7, an IC package 650 may include multiple dies 656 (e.g., with one or more of the multiple dies 656 coupled to the example FET 200 included in the package substrate 652). An IC package 650 may include additional passive components, such as surface-mount resistors, capacitors, and inductors disposed on the first face 672 or the second face 674 of the package substrate 652. More generally, an IC package 650 may include any other active or passive components known in the art.

Figure 8:
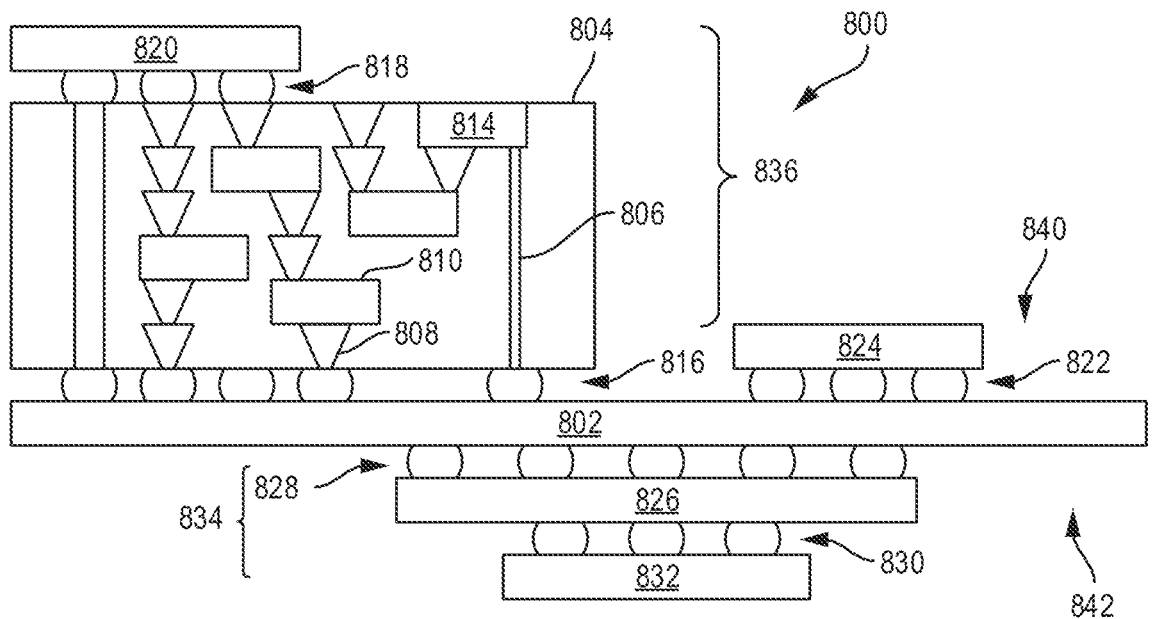
FIG. 8 is a cross-sectional side view of an example IC device assembly that may include an FET, such as the example FET of FIG. 2A, in accordance with any of the examples disclosed herein.

FIG. 8 is a cross-sectional side view of an IC device assembly 800 that may include one or more IC packages or other electronic components (e.g., a die) including one or more of the example FET(s) 200, in accordance with any of the examples disclosed herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802; generally, components may be disposed on one or both faces 840 and 842. Any of the IC packages discussed below with reference to the IC device assembly 800 may take the form of any of the examples of the IC package 650 discussed above with reference to FIG. 7 (e.g., may include one or more of the example FET(s) 200 in a package substrate 652 or in a die).

In some examples, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (alone or in conjunction with other metal layers) between the components coupled to the circuit board 802. In other examples, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. The IC package 820 may be or include, for example, a die (the die 502 of FIG. 5), an IC device (e.g., the IC device 600 of FIG. 6), or any other suitable component. Generally, the interposer 804 may spread a connection to a wider pitch or reroute a connection to a different connection. For example, the interposer 804 may couple the IC package 820 (e.g., a die) to a set of BGA conductive contacts of the coupling components 816 for coupling to the circuit board 802. In the examples illustrated in FIG. 8, the IC package 820 and the circuit board 802 are attached to opposing sides of the interposer 804; in other examples, the IC package 820 and the circuit board 802 may be attached to a same side of the interposer 804. In some examples, three or more components may be interconnected by way of the interposer 804.

The interposer 804 may be formed of an epoxy resin, a fiberglass-reinforced epoxy resin, an epoxy resin with inorganic fillers, a ceramic material, or a polymer material such as polyimide. In some examples, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art. In some examples, the interposer 804 may include one or more of the example FET 200.

The IC device assembly 800 may include an IC package 824 coupled to the first face 840 of the circuit board 802 by coupling components 822. The coupling components 822 may take the form of any of the examples discussed above with reference to the coupling components 816, and the IC package 824 may take the form of any of the examples discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the examples of the coupling components 816 discussed above, and the IC packages 826 and 832 may take the form of any of the examples of the IC package 1820 discussed above. The package-on-package structure 834 may be configured in accordance with any of the package-on-package structures known in the art.

Figure 9:
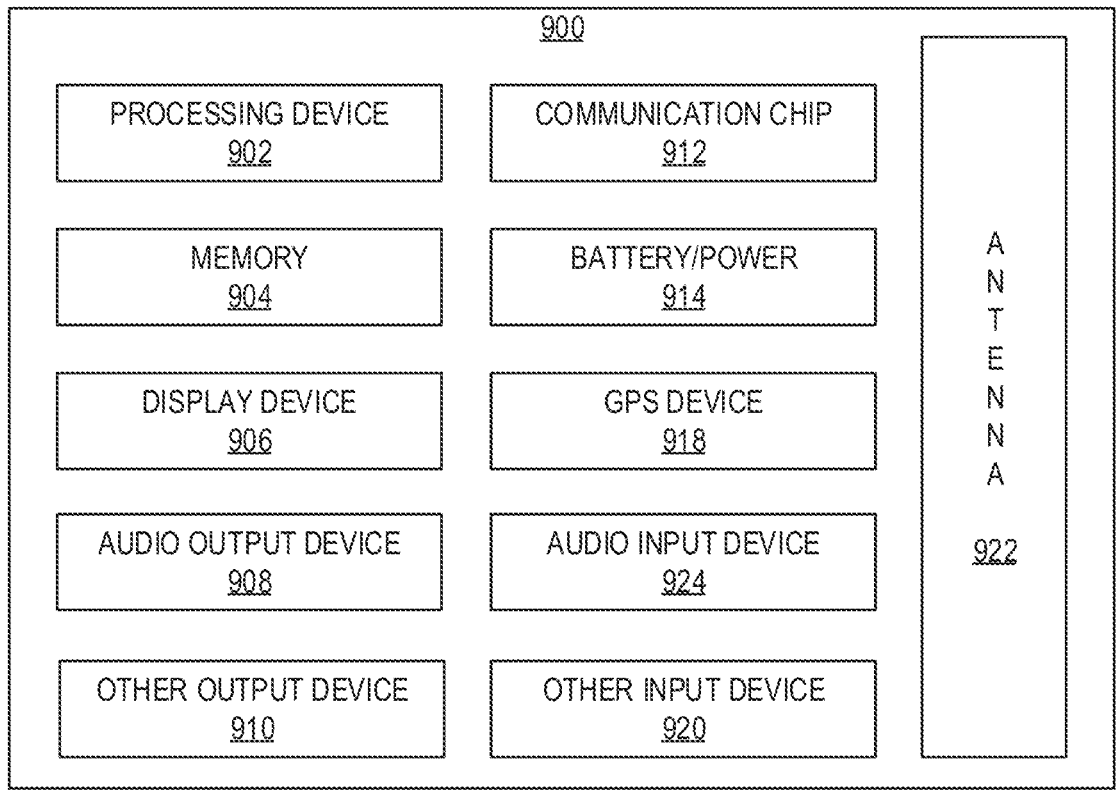
FIG. 9 is a block diagram of an example electrical device that may include an FET, such as the example FET of FIG. 2A, in accordance with any of the examples disclosed herein.

FIG. 9 is a block diagram of an example electrical device 900 that may include one or more the example FET(s) 200, in accordance with any of the examples disclosed herein. For example, any suitable ones of the components of the electrical device 900 may include one or more of the IC packages 650, IC devices 600, or dies 502 disclosed herein. A number of components are illustrated in FIG. 9 as included in the electrical device 900, but any one or more of these components may be omitted or duplicated, as suitable for the application. In some examples, some or all of the components included in the electrical device 900 may be attached to one or more motherboards. In some examples, some or all of these components are fabricated onto a single system-on-a-chip (SoC) die.

Additionally, in various examples, the electrical device 900 may not include one or more of the components illustrated in FIG. 9, but the electrical device 900 may include interface circuitry for coupling to the one or more components. For example, the electrical device 900 may not include a display device 906, but may include display device interface circuitry (e.g., a connector and driver circuitry) to which a display device 906 may be coupled. In another set of examples, the electrical device 900 may not include an audio input device 924 or an audio output device 908, but may include audio input or output device interface circuitry (e.g., connectors and supporting circuitry) to which an audio input device 924 or audio output device 1908 may be coupled.

The electrical device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 904 may include memory that shares a die with the processing device 902. This memory may be used as cache memory and may include embedded dynamic random access memory (eDRAM) or spin transfer torque magnetic random access memory (STT-MRAM). One or more of the FET(s) 200 may be located in one or more of the components of FIG. 9.

In some examples, the electrical device 900 may include a communication chip 912 (e.g., one or more communication chips). For example, the communication chip 912 may be configured for managing wireless communications for the transfer of data to and from the electrical device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other examples. The electrical device 900 may include an antenna 922 to facilitate wireless communications and/or to receive other wireless communications (such as AM or FM radio transmissions).

In some examples, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as global positioning system (GPS), EDGE, GPRS, CDMA, WiMAX, LTE, EV-DO, or others. In some examples, a first communication chip 912 may be dedicated to wireless communications, and a second communication chip 912 may be dedicated to wired communications.

The electrical device 900 may include battery/power circuitry 914. The battery/power circuitry 914 may include one or more energy storage devices (e.g., batteries or capacitors) and/or circuitry for coupling components of the electrical device 900 to an energy source separate from the electrical device 900 (e.g., AC line power).

The electrical device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display.

The electrical device 900 may include an audio output device 908 (or corresponding interface circuitry, as discussed above). The audio output device 908 may include any device that generates an audible indicator, such as speakers, headsets, or earbuds.

The electrical device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The electrical device 900 may include a GPS device 918 (or corresponding interface circuitry, as discussed above). The GPS device 918 may be in communication with a satellite-based system and may receive a location of the electrical device 900, as known in the art.

The electrical device 900 may include another output device 10 (or corresponding interface circuitry, as discussed above). Examples of the other output device 910 may include an audio codec, a video codec, a printer, a wired or wireless transmitter for providing information to other devices, or an additional storage device.

The electrical device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 900 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1800 may be any other electronic device that processes data.

From the foregoing, it will be appreciated that example FETs, electric devices including one or more such FETs, example systems including one or more such FETs, and methods of fabricating such FETs have been disclosed. In some examples, the FET(s) are constructed in a vertical fashion, substantially perpendicular to a substrate. Example FETS disclosed herein have reduced leakage, provide improved electrical isolation (which is beneficial in high voltage applications, for example), improved channel length control, and have zero or near zero distance between the source and the gate. As such, example FETs achieve higher performance and higher yield efficiency than known FETs.

The following paragraphs provide various examples of the examples disclosed herein.

Example 1 includes field-effect transistor including a substrate, a source above the substrate, a semiconductor region above the source, a drain above semiconductor region, a polarization layer disposed on the semiconductor region between the drain and an end of the semiconductor region, and a gate above the source adjacent the end of the semiconductor region.

Example 2 includes the field-effect transistor of Example 1, wherein the source separates the drain from the substrate.

Example 3 includes the field-effect transistor of Examples 1 or 2, wherein the end is a first end, and the drain is on the semiconductor region at or near a second end of the semiconductor region opposite the first end of the semiconductor region.

Example 4 includes the field-effect transistor of Example 3, wherein the source includes a lower section and a raised section extending from the lower section in a direction away from the substrate, the first end of the semiconductor region above the raised section.

Example 5 includes the field-effect transistor of Example 4, wherein a bottom of the first end of the semiconductor region is in contact with the raised section of the source region and a bottom of the second end the semiconductor region is in contact with an interlayer dielectric layer between the semiconductor region and the source.

Example 6 includes the field-effect transistor of any of Examples 1-5, wherein less than about 20% of a bottom of the semiconductor region is in contact with the source.

Example 7 includes the field-effect transistor of any of Examples 1-6, wherein the gate is to, when activated, form a channel in the end of the semiconductor region.

Example 8 includes the field-effect transistor of Example 7, wherein the semiconductor region has a height, the height defining a length of the channel.

Example 9 includes the field-effect transistor of any of Examples 1-8, wherein the gate is adjacent the source.

Example 10 includes the field-effect transistor of any of Examples 1-9, wherein the gate includes gate metal and gate oxide, the gate oxide in contact with the end of the semiconductor region, and the gate oxide in contact with the source.

Example 11 includes the field-effect transistor of Example 10, further including a recess defined in the source, the recess containing an oxide region, the gate disposed above the oxide region.

Example 12 includes the field-effect transistor of any of Examples 1-11, wherein the semiconductor region includes a III-V material.

Example 13 includes the field-effect transistor of any of Examples 1-12, further including a gate contact disposed above the gate, the gate contact being wider than the gate such that a portion of the gate contact is above the polarization layer.

Example 14 includes the field-effect transistor of any of Examples 1-13, wherein the gate is tapered from a larger cross-section to a smaller cross-section in a direction toward the source.

Example 15 includes a system including a processing device including a communications chip and a field-effect transistor, the field-effect transistor. The field-effect transistor includes a substrate, a source above the substrate, a semiconductor region above the source, a drain above semiconductor region, a polarization layer disposed on the semiconductor region between the drain and an end of the semiconductor region, and a gate above the source adjacent an end of the semiconductor region.

Example 16 includes the system of Example 15, wherein the source separates the drain from the substrate.

Example 17 includes the system of Examples 15 or 16, wherein the end is a first end, and the drain is on the semiconductor region at or near a second end of the semiconductor region opposite the first end of the semiconductor region.

Example 18 includes the system of Example 17, wherein the source includes a lower section and a raised section extending from the lower section in a direction away from the substrate, the first end of the semiconductor region above the raised section.

Example 19 includes the system of Example 18, wherein a bottom of the first end of the semiconductor region is in contact with the raised section of the source and a bottom of the second end the semiconductor region is in contact with an interlayer dielectric layer between the semiconductor region and the source.

Example 20 includes the system of any of Examples 15-19, wherein less than about 20% of a bottom of the semiconductor region is in contact with the source.

Example 21 includes the system of any of Examples 15-20, wherein the gate is to, when activated, form a channel in the end of the semiconductor region.

Example 22 includes the system of Example 21, wherein the semiconductor region has a height, the height defining a length of the channel.

Example 23 includes the system of any of Examples 15-22, wherein the gate is adjacent the source.

Example 24 includes the system of any of Examples 15-23, wherein the gate includes gate metal and gate oxide, the gate oxide in contact with the end of the semiconductor region, and the gate oxide in contact with the source.

Example 25 includes the system of Example 24, wherein the field-effect transistor further includes a recess defined in the source, the recess containing an oxide region, the gate disposed above the oxide region.

Example 26 includes the system of any of Examples 15-25, wherein the semiconductor region includes a III-V material.

Example 27 includes the system of any of Examples 15-26, wherein the field-effect transistor further includes a gate contact disposed above the gate, the gate contact being wider than the gate such that a portion of the gate contact is above the polarization layer.

Example 28 includes the system of any of Examples 15-27, wherein the gate is tapered from a larger cross-section to a smaller cross-section in a direction toward the source.

Example 29 includes a field-effect transistor including a substrate, a source, a semiconductor region having an end above the source, a drain above the semiconductor region, a polarization layer disposed on the semiconductor region between the drain and the end of the semiconductor region, and a gate adjacent the end of the semiconductor region and above the source, the gate, when activated, to form a non-horizontally oriented channel in the end of the semiconductor region.

Example 30 includes the field-effect transistor of Example 29, wherein the source isolates the drain from the substrate.

Example 31 includes the field-effect transistor of Examples 29 or 30, further including a buffer layer disposed between the substrate and the source.

Example 32 includes the field-effect transistor of claim 31, wherein the buffer layer includes aluminum nitride (AlN), aluminum gallium nitride (AlGaN), and gallium nitride (GaN).

Example 33 includes the field-effect transistor of any of Examples 29-32, wherein the source includes N doped indium gallium nitride (N+InGaN).

Example 34 includes the field-effect transistor of Example 33, wherein the drain includes N doped indium gallium nitride (N+InGaN).

Example 35 includes the field-effect transistor of any of Examples 29-34, wherein the semiconductor region includes gallium nitride (GaN).

Example 36 includes the field-effect transistor of any of Examples 29-35, wherein the end is a first end, the drain in contact with the semiconductor region at or near a second end of the semiconductor region opposite the first end of the semiconductor region, the first end of the semiconductor region is in contact with the source and the gate, and the gate is in contact with the source.

Example 37 includes the field-effect transistor of Example 36, further including an interlayer dielectric layer disposed between the semiconductor region and the source near the second end of the semiconductor region.

Example 38 includes the field-effect transistor of any of Examples 29-37, wherein the semiconductor region includes a III-V material.

Example 39 includes the field-effect transistor of any of Examples 29-38, wherein the gate is tapered from a larger cross-section to a smaller cross-section in a direction toward the source.

Example 40 includes the field-effect transistor of any of Examples 29-39, wherein the gate includes a gate metal and a gate oxide layer, the gate oxide layer in contact with the semiconductor region and with the source.

Example 41 includes the field-effect transistor of any of Examples 29-40, further including a source contact above the source, a drain contact above the drain, and a gate contact above the gate, the drain contact located between the gate contact and the source contact.

Example 42 includes the field-effect transistor of Example 41, wherein a bottom of the gate contact extends laterally beyond the gate.

Example 43 includes the field-effect transistor of any of Examples 29-42, wherein the end is a first end, the drain is a first drain, the semiconductor region is a first semiconductor region, the channel is a first channel, and further including a second semiconductor region having a first end, and a second drain above the second semiconductor region near a second end of the second semiconductor region opposite the first end of the second semiconductor region, the gate adjacent the first end of the second semiconductor region, the gate, when activated, to form a vertically disposed second channel along the first end of the second semiconductor region.

Example 44 includes a method to manufacture a field-effect transistor, the method including forming a source above a substrate, forming a semiconductor region above the source, depositing a polarization layer on the semiconductor region, forming a drain above the semiconductor region, such that the polarization layer extends between the drain and an end of the semiconductor region, and forming a gate above the source at the end of the semiconductor region.

Example 45 includes the method of Example 44, wherein the source includes N doped indium gallium nitride (N+InGaN), and forming the source includes growing the source via an epitaxial growth process.

Example 46 includes the method of Example 45, further including forming a buffer layer on the substrate, and wherein forming the source includes growing the source on the buffer layer.

Example 47 includes the method of any of Examples 44-46, wherein the source isolates the drain from the substrate.

Example 48 includes the method of any of Examples 44-47, wherein the semiconductor region includes gallium nitride (GaN), and wherein forming the semiconductor region includes depositing an interlayer dielectric layer on the source, forming a recess in the interlayer dielectric to expose a top of the source, and forming the semiconductor region in the recess via an epitaxial growth process, such that a first portion of a bottom of the semiconductor region is in contact with the source and a second portion of the bottom of the semiconductor region is in contact with the interlayer dielectric layer.

Example 49 includes the method of Example 48, wherein the drain includes N doped indium gallium nitride (N+InGaN), and forming the drain includes growing the drain via an epitaxial growth process on the semiconductor region.

Example 50 includes the method of Example 48, wherein forming the semiconductor region includes stopping the epitaxial growth process at a target height to define a length of a channel to be formed on the end of the semiconductor region when the gate is activated.

Example 51 includes the method of any of Examples 44-50, wherein the semiconductor region includes a III-V material.

Example 52 includes the method of any of Examples 44-51, wherein forming the gate includes forming a recess in the semiconductor region that extends into the source, and depositing gate metal and gate oxide into the recess, the gate oxide separating the gate metal from the end of the semiconductor region and the source.

Example 53 includes the method of any of Examples 44-52, wherein the recess is tapered from a larger cross-section to a smaller cross-section in a direction of the source.

Example 54 includes the method of any of Examples 44-53, further including depositing an interlayer dielectric layer on the source, forming a contact trench in the interlayer dielectric, and depositing contact material into the contact trench to form a source contact that is in contact with the source.

Although certain example methods, apparatus, and articles of manufacture have been disclosed herein, the scope of coverage of this patent is not limited thereto. On the contrary, this patent covers all methods, apparatus, and articles of manufacture fairly falling within the scope of the claims of this patent.

What is claimed is:

1. A field-effect transistor comprising:
    a substrate;
    a source above the substrate;
    a semiconductor region above the source;
    a drain above the semiconductor region;
    a polarization layer on the semiconductor region between the drain and an end of the semiconductor region; and
    a gate above the source adjacent the end of the semiconductor region.

2. The field-effect transistor of claim 1, wherein the source separates the drain from the substrate.

3. The field-effect transistor of claim 1, wherein the end is a first end, and the drain is on the semiconductor region at or near a second end of the semiconductor region opposite the first end of the semiconductor region.

4. The field-effect transistor of claim 3, wherein the source comprises a lower section and a raised section extending from the lower section in a direction away from the substrate, the first end of the semiconductor region above the raised section.

5. The field-effect transistor of claim 4, wherein a bottom of the first end of the semiconductor region is in contact with the raised section of the source region and a bottom of the second end the semiconductor region is in contact with an interlayer dielectric layer between the semiconductor region and the source.

6. The field-effect transistor of claim 1, wherein less than about 20% of a bottom of the semiconductor region is in contact with the source.

7. The field-effect transistor of claim 1, wherein the gate is to, when activated, form a channel in the end of the semiconductor region.

8. The field-effect transistor of claim 7, wherein the semiconductor region has a height, the height defining a length of the channel.

9. The field-effect transistor of claim 1, wherein the gate comprises a gate metal and a gate oxide, the gate oxide in contact with the end of the semiconductor region, and the gate oxide in contact with the source.

10. The field-effect transistor of claim 1, wherein the semiconductor region comprises a III-V material.

11. The field-effect transistor of claim 1, wherein the gate is tapered from a larger cross-section to a smaller cross-section in a direction toward the source.

12. A field-effect transistor comprising:
    a substrate;
    a source;
    a semiconductor region having an end above the source;
    a drain above the semiconductor region;
    a polarization layer on the semiconductor region between the drain and the end of the semiconductor region; and
    a gate adjacent the end of the semiconductor region and above the source, the gate, when activated, to form a non-horizontally oriented channel in the end of the semiconductor region.

13. The field-effect transistor of claim 12, wherein the end is a first end, the drain in contact with the semiconductor region at or near a second end of the semiconductor region opposite the first end of the semiconductor region, the first end of the semiconductor region is in contact with the source and the gate, and the gate is in contact with the source.

14. The field-effect transistor of claim 13, further comprising an interlayer dielectric layer disposed between the semiconductor region and the source near the second end of the semiconductor region.

15. The field-effect transistor of claim 12, further comprising:
    a source contact above the source;
    a drain contact above the drain; and
    a gate contact above the gate, the drain contact located between the gate contact and the source contact.

16. The field-effect transistor of claim 12, wherein the end is a first end, the drain is a first drain, the semiconductor region is a first semiconductor region, the channel is a first channel, the field-effect transistor further comprising:
    a second semiconductor region having a first end; and
    a second drain above the second semiconductor region near a second end of the second semiconductor region opposite the first end of the second semiconductor region, the gate adjacent the first end of the second semiconductor region, the gate, when activated, to form a vertically disposed second channel along the first end of the second semiconductor region.

17. A method to manufacture a field-effect transistor, the method comprising:
    forming a source above a substrate;
    forming a semiconductor region above the source;
    depositing a polarization layer on the semiconductor region;
    forming a drain above the semiconductor region, wherein the polarization layer extends between the drain and an end of the semiconductor region; and
    forming a gate above the source at the end of the semiconductor region.

18. The method of claim 17, wherein the semiconductor region comprises gallium nitride (GaN), and wherein forming the semiconductor region comprises:
    depositing an interlayer dielectric layer on the source;
    forming a recess in the interlayer dielectric to expose a top of the source; and
    forming the semiconductor region in the recess via an epitaxial growth process, such that a first portion of a bottom of the semiconductor region is in contact with the source and a second portion of the bottom of the semiconductor region is in contact with the interlayer dielectric layer.

19. The method of claim 18, wherein the drain comprises N doped indium gallium nitride (N+InGaN), and forming the drain comprises growing the drain via an epitaxial growth process on the semiconductor region.

20. The method of claim 18, wherein forming the semiconductor region comprises stopping the epitaxial growth process at a target height to define a length of a channel to be formed on the end of the semiconductor region when the gate is activated.

* * * * *